United States Patent [19]
Brady et al.

[11] Patent Number: 6,100,804
[45] Date of Patent: Aug. 8, 2000

[54] RADIO FREQUENCY IDENTIFICATION SYSTEM

[75] Inventors: Michael J. Brady, Brewster; Dah-Weih Duan, Yorktown Heights; Venkata S. R. Kodukula, Peekstill, all of N.Y.

[73] Assignee: Intecmec IP Corp., Woodland Hills, Calif.

[21] Appl. No.: 09/182,170

[22] Filed: Oct. 29, 1998

Related U.S. Application Data

[60] Provisional application No. 60/093,088, Jul. 16, 1998.

[51] Int. Cl.[7] .................................................. G08B 13/14
[52] U.S. Cl. ................................. 340/572.7; 340/572.8; 342/44; 342/51; 342/42; 343/872; 343/873; 257/787; 257/678; 257/679; 257/688
[58] Field of Search ........................... 340/572.1, 572.7, 340/572.8; 342/42, 44, 51; 343/872, 873; 257/787, 678, 679, 688

[56] References Cited

U.S. PATENT DOCUMENTS

| | | | |
|---|---|---|---|
| 4,001,822 | 1/1977 | Sterzer | 342/44 |
| 4,075,632 | 2/1978 | Baldwin et al. | 342/51 |
| 4,360,810 | 11/1982 | Landt | 342/44 |
| 4,782,345 | 11/1988 | Landt | 343/727 |
| 4,786,907 | 11/1988 | Koelle | 342/51 |
| 4,816,389 | 3/1989 | Sansonetti et al. | 435/6 |
| 4,835,377 | 5/1989 | Brown | 235/492 |
| 4,853,705 | 8/1989 | Landt | 343/803 |
| 4,864,158 | 9/1989 | Koelle et al. | 327/31 |
| 4,888,591 | 12/1989 | Landt et al. | 342/44 |
| 4,999,636 | 3/1991 | Landt et al. | 342/90 |
| 5,030,807 | 7/1991 | Landt et al. | 235/375 |
| 5,055,659 | 10/1991 | Hendrick et al. | 340/10.51 |
| 5,479,160 | 12/1995 | Koelle | 340/825.7 |
| 5,485,520 | 1/1996 | Chaum et al. | 705/74 |
| 5,504,485 | 4/1996 | Landt et al. | 342/42 |
| 5,510,795 | 4/1996 | Koelle | 342/114 |
| 5,521,601 | 5/1996 | Kandlur et al. | 342/44 |
| 5,528,222 | 6/1996 | Moskowitz et al. | 340/572.7 |
| 5,538,803 | 7/1996 | Gambino et al. | 428/694 TM |
| 5,550,547 | 8/1996 | Chan et al. | 342/42 |
| 5,552,778 | 9/1996 | Schrott et al. | 340/825.34 |
| 5,554,974 | 9/1996 | Brady et al. | 340/572.6 |
| 5,563,583 | 10/1996 | Brady et al. | 340/572.2 |
| 5,565,847 | 10/1996 | Gambino et al. | 340/572.6 |
| 5,574,470 | 11/1996 | de Vall | 343/895 |
| 5,606,323 | 2/1997 | Heinrich et al. | 340/10.34 |
| 5,635,693 | 6/1997 | Benson et al. | 340/10.33 |
| 5,654,693 | 8/1997 | Cocita | 340/572.1 |
| 5,673,037 | 9/1997 | Cesar et al | 340/10.32 |
| 5,680,106 | 10/1997 | Schrott et al. | 340/10.33 |
| 5,682,143 | 10/1997 | Brady et al. | 340/572.7 |
| 5,682,296 | 10/1997 | Horejs, Jr. et al. | 361/737 |
| 5,729,201 | 3/1998 | Jahnes et al. | 340/572.1 |

(List continued on next page.)

FOREIGN PATENT DOCUMENTS

| | | |
|---|---|---|
| 0 294 963 | 12/1988 | European Pat. Off. . |
| 0 646 983 | 4/1995 | European Pat. Off. . |
| WO 98/16070 | 4/1998 | WIPO . |

OTHER PUBLICATIONS

"Multifunction Credit Card Package" IBM Technical Disclosure Bulletin, vol. 38, No. 08, Aug. 1995, p 17.

"A Low–Power CMOS Integrated Circuit for Field–Powered Radio Frequency Identification Tag" by Friedman et al., 1997 IEEE International Solid State Circits Conference, Paper SA 17.5, pp. 294, 295, 474.

*Primary Examiner*—Benjamin C. Lee
*Attorney, Agent, or Firm*—O'Melveny & Myers LLP

[57] ABSTRACT

A radio frequency identification system employing a thin, flexible electronic radio frequency identification (RFID) tag having an overall thickness not exceeding approximately 280 microns and the process for its manufacture is disclosed. The RFID tag includes an insulating, flexible substrate having an aperture formed therein for receiving an RFID circuit chip. An antenna forming an integral part of the substrate is electrically connected to circuit chip. A cured adhesive having a portion substantially parallel with the substrate encapsulates the circuit chip so that the chip is operably retained within the substrate aperture.

45 Claims, 19 Drawing Sheets

U.S. PATENT DOCUMENTS

| | | | |
|---|---|---|---|
| 5,729,697 | 3/1998 | Schkolnick et al. | 705/23 |
| 5,736,929 | 4/1998 | Schrott et al. | 340/572.1 |
| 5,737,710 | 4/1998 | Anthonyson | 701/1 |
| 5,739,754 | 4/1998 | Schrott et al. | 340/572.2 |
| 5,767,789 | 6/1998 | Afzali-Ardakani et al. | 340/10.1 |
| 5,771,021 | 6/1998 | Veghte et al. | 343/700 MS |
| 5,777,561 | 7/1998 | Chieu et al. | 340/10.72 |
| 5,786,626 | 7/1998 | Brady et al. | 257/673 |
| 5,812,065 | 9/1998 | Schrott et al. | 340/10.34 |
| 5,821,859 | 10/1998 | Schrott et al. | 340/572.6 |
| 5,825,329 | 10/1998 | Veghte et al. | 343/700 MS |
| 5,826,328 | 10/1998 | Brady et al. | 29/827 |
| 5,828,318 | 10/1998 | Cesar | 340/825.69 |
| 5,828,693 | 10/1998 | Mays et al. | 375/136 |
| 5,831,532 | 11/1998 | Gambino et al. | 340/572.1 |
| 5,850,181 | 12/1998 | Heinrich et al. | 340/572.1 |
| 5,850,187 | 12/1998 | Carrender et al. | 340/10.6 |
| 5,874,902 | 2/1999 | Heinrich et al. | 340/10.51 |

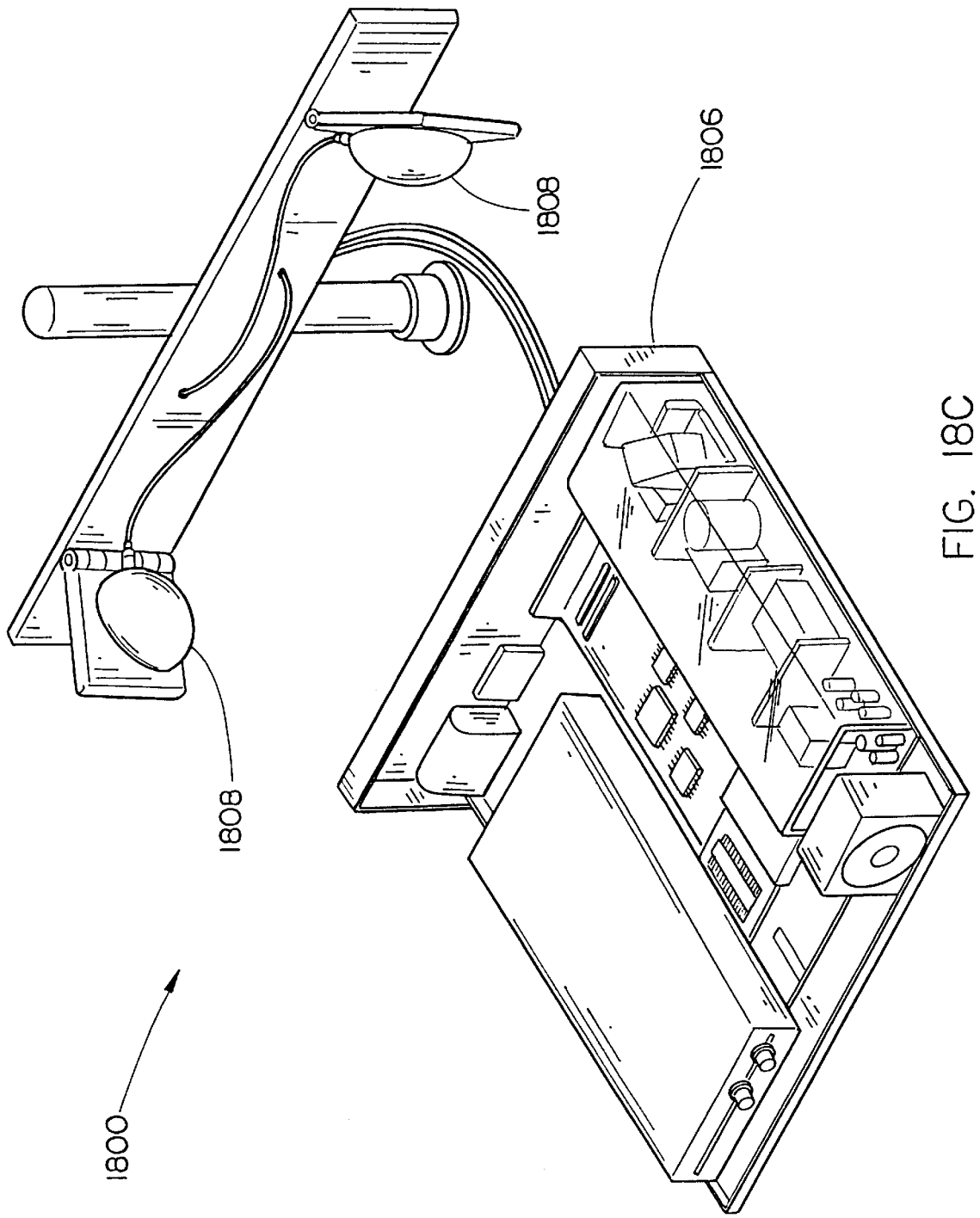

RADIO FREQUENCY IDENTIFICATION SYSTEM

CROSS-REFERENCE TO RELATED APPLICATIONS

The present application claims the benefit under 35 U.S.C. § 119(e) of U.S. Provisional Application No. 60/093,088, filed Jul. 16, 1998. Said U.S. Provisional Application No. 60/093,088 is herein incorporated by reference in its entirety.

INCORPORATION BY REFERENCE

The following U.S. Patents and Patent Applications are hereby incorporated herein by reference in their entirety:

U.S. Patents

| Patent No. | Issue Date | Filing Date | Attorney Docket No. |
|---|---|---|---|
| 5,521,601 | 05/28/96 | 04/21/95 | YO995-0088 |
| 5,528,222 | 06/18/96 | 09/09/94 | YO994-180 |
| 5,538,803 | 07/23/96 | 11/23/94 | YO994-0073 |
| 5,550,547 | 08/27/96 | 09/12/94 | YO994-185 |
| 5,552,778 | 09/03/96 | 11/23/94 | YO994-0232 |
| 5,554,974 | 09/10/96 | 11/23/94 | YO994-0071 |
| 5,563,583 | 10/08/96 | 11/23/94 | YO994-070 |
| 5,565,847 | 10/15/96 | 11/23/94 | YO994-0072 |
| 5,606,323 | 02/25/97 | 08/31/95 | YO995-157 |
| 5,635,693 | 06/03/97 | 02/02/95 | YO994-0215 |
| 5,673,037 | 09/30/97 | 09/09/94 | YO994-184 |
| 5,680,106 | 10/21/97 | 10/27/95 | YO995-0219 |
| 5,682,143 | 10/28/97 | 09/09/94 | YO994-170 |
| 5,729,201 | 03/17/98 | 06/29/95 | YO995-109 |
| 5,729,697 | 03/17/98 | 04/24/95 | YO995-076 |
| 5,736,929 | 04/07/98 | 06/07/96 | YO996-085 |
| 5,777,561 | 07/07/98 | 09/30/96 | YO996-178 |

U.S. Nonprovisional Patent Applications

| Application No. | Filing Date | Attorney Docket No. |
|---|---|---|
| 08/681,741 | 07/29/96 | YO996-037 |
| 08/660,249 | 06/07/96 | YO996-084 (allowed 4-28-98) |
| 08/621,784 | 03/25/96 | YO996-031 |
| 08/626,820 | 04/03/96 | YO995-158 |
| 08/646,539 | 05/08/96 | YO996-068 |
| 08/681,741 | 07/29/96 | YO996-037 |
| 08/694,606 | 08/09/996 | YO995-218 |
| 08/790,639 | 01/29/97 | YO997-024 |
| 08/790,640 | 01/29/97 | YO997-023 |
| 08/733,684 | 10/17/96 | YO996-195 |
| 08/862,149 | 05/23/97 | YO997-116 |
| 08/862,912 | 05/23/97 | YO997-115 |
| 08/862,913 | 05/23/97 | YO997-114 |
| 08/909,719 | 08/12/97 | YO995-109B (allowed) |
| 08/935,989 | 10/23/97 | YO997-310 |

U.S. Provisional Patent Applications

| Application No. | Filing Date | Attorney Docket No. |
|---|---|---|
| 60/073,102 | 01/30/98 | YO897-0028P1 |
| 60/074,605 | 02/13/98 | YO897-0259P1 |
| 60/077,879 | 03/13/98 | YO997-0038P1 |
| 60/078,287 | 03/17/98 | YO897-0661P1 |
| 60/091,350 | 07/01/98 | YO897-0259P2 |
| 60/078,304 | 03/17/98 | YO897-0662P1 |
| 60/093,088 | 07/16/98 | 38384P1 |

The following further documents are also incorporated herein by reference in their entirety:

IBM Technical Disclosure Bulletin

IBM Technical Disclosure Bulletin: Vol. 38 No. 08, August 1995, page 17, "Multifunction Credit Card Package," by Brady, Moskowitz, and Murphy.

Literature Reference

D. Friedman, H. Heinrich, D. Duan, "A low-power CMOS integrated circuit for field-powered radio frequency identification (RFID) tags," 1997 Digest of Technical Papers of the IEEE International Solid-State Circuits Conference (ISSCC), San Francisco, Calif., February 1997.

| Application No. | Filing Date | Attorney Docket No. |
|---|---|---|
| PCT Published International Applications | | |
| PCT/GB96/00061 | 01/15/96 | UK 9-94-066 PCT |
| PCT/EP95/03703 | 10/20/95 | YO994-242 PCT |
| UK Published Application | | |
| 9710025.9 | 05/19/97 | YO9-96-084 |

FIELD OF THE INVENTION

The present invention relates generally to radio frequency identification (RFID) systems, and more specifically to RFID systems employing thin flexible RFID tags or transponders.

BACKGROUND OF THE INVENTION

Radio Frequency Identification (RFID) is becoming an important identification technology for tracking objects such as luggage, packages, merchandise, and the like. RFID systems provide identification functions not found in more conventional identification technologies such as optical indicia (e.g., bar code) recognition systems. For example, an RFID system may utilize RFID tags containing read/write memory of up to several kilobytes. Further, several such RFID tags may be read by a system at one time. These RFID tags are readable at a distance and do not require direct line-of-sight view by the reading apparatus.

A typical RFID tag or transponder consists of a semiconductor chip having RF circuits, logic, and memory, an antenna (and a battery in the case of active tags), mounted to a substrate. This substrate may be enclosed (encapsulated, laminated, etc.) so that it is protected from the environment. Known to the art are thin RFID tags such as the thin RFID tag disclosed in U.S. Pat. No. 5,528,222 issued to Brady et al. As shown in FIG. 1, such RFID tags 100 typically include an RF circuit chip 102 which is mounted in a flexible substrate 104. The chip 102 is bonded to an antenna 106 contained on the substrate 104. A window 108 is formed in the substrate 104 allowing the insertion of the chip 102 therein so that the thickness of the substrate 104 is not added to the thickness of the chip 102. The window 108 allows coating of the chip 102 with an encapsulant 110. The encapsulant 110 protects the chip 102 and bonds (e.g., contacts 112 and bumps 114) between the antenna 106 and chip 102 from environmental exposure. The RFID tag 100 is sealed by thin flexible laminations 116 consisting of an inner coating of hot melt adhesive 118 (such as ethyl-vinyl-acetate (EVA), phenolic butyral, or silicone adhesive) and an outer coating of tough polymeric material 120 (such as polyester, Mylar, polyimide, or polyethylene).

The antenna 106 (typically, a resonant dipole, loop or folded dipole antenna) is integrally formed on the substrate 104. The antenna 106 consists of thin, typically 25 to 35 micron thick (s) copper lines, which are etched onto a copper/organic laminate substrate or plated onto an organic substrate. Typical materials used are polyester or polyimide for the organic substrate 104 and electroplated or rolled annealed copper for the antenna 106. The copper may be gold or nickel plated to facilitate bonding. The chip 102 is connected to the antenna 106 by means of bumps 114 on the contacts 112 of the chip 102.

The chip 102 may be made to be 225 to 375 microns thick (w) by thinning. In general, semiconductors are manufactured on thick wafers, up to 1 mm thick. Thinning is accomplished by polishing or back grinding the wafer after manufacture. Similarly, in such prior art RFID tags, the thickness (v) of the substrate is typically 225 microns or less, the thickness (m) of the bonding structures (contact 112 and bump 114) is typically 50 microns, the thickness (q & u) of laminating materials 116 is typically 50 to 125 microns per side, and the thickness (r) of the encapsulate above the antenna and substrate is typically 50 microns. Thus, the total thickness (t) of such prior art RFID tags typically ranges from approximately 500 to 750 microns.

However, it is desirable to provide extremely thin, flexible RFID tags which may be embedded in thin labels in laminated and printed forms. Such labels include luggage or shipping tags typically used by airlines or other shippers to track the transportation of luggage and other packages or objects, wrist-band identification bracelets for tracking the movement patients in a hospital, or animal collars for tracking the movement of animals such as household pets, farm animals, and the like. It is further desirable to use such labels in existing printers wherein the label embedded with the RFID tag is printed with indicia such as a barcode, alphanumeric characters or the like. However, the presence of the RFID tag embedded in the label introduces a "bump" in the label which may cause excessive wear in the roller and print head of the printer. Thus, reducing the thickness of the "bump" (i.e., the RFID tag) would improve the useful life of such printers. Consequently, it is desirable to provide extremely thin RFID tags having flexible substrates and overall thicknesses of less than 300 microns.

SUMMARY OF THE INVENTION

Accordingly, the present invention is directed to radio frequency identification system employing a novel thin flexible electronic radio frequency identification (RFID) tag having an overall thickness not exceeding approximately 280 microns. The RFID tag includes an insulating, flexible substrate having an aperture formed therein for receiving a circuit chip which comprises a modulator circuit, a logic circuit, a memory circuit, and chip antenna connectors. An antenna forming an integral part of the substrate is electrically connected to the antenna connectors of the circuit chip. In one embodiment of the invention, this is accomplished by providing connectors which electrically connect the antenna to the chip antenna connector. In an alternative embodiment, ends of the antenna are cantilevered over the substrate aperture and connected directly with the chip antenna connectors. A cured encapsulant having a portion substantially parallel with the substrate encapsulates the circuit chip so that the chip is operably retained within the substrate aperture.

The present invention is also directed to a novel process for manufacturing a thin flexible RFID tag. The process includes the steps of forming an aperture in an insulating thin flexible substrate material; forming an antenna as an integral part of the substrate; backing the substrate aperture so as to form a chip support platform; placing a circuit chip having a modulator circuit, a logic circuit, a memory circuit, and chip antenna connectors on the chip support platform within the substrate aperture so as to form an annular space between the chip and the substrate aperture walls; electrically connecting the chip with the antenna; encapsulating the chip within the annular space so as to secure the chip within the annular space and so as to protect the chip and chip and antenna electrical connections; and reducing the overall thickness of the circuit by modifying at least one surface of the encapsulant.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which:

FIG. 18C is an isometric view depicting apparatus for reading RFID tags;

DETAILED DESCRIPTION OF THE INVENTION

Reference will now be made in detail to the presently preferred embodiments of the invention, examples of which are illustrated in the accompanying drawings.

Figure 1:
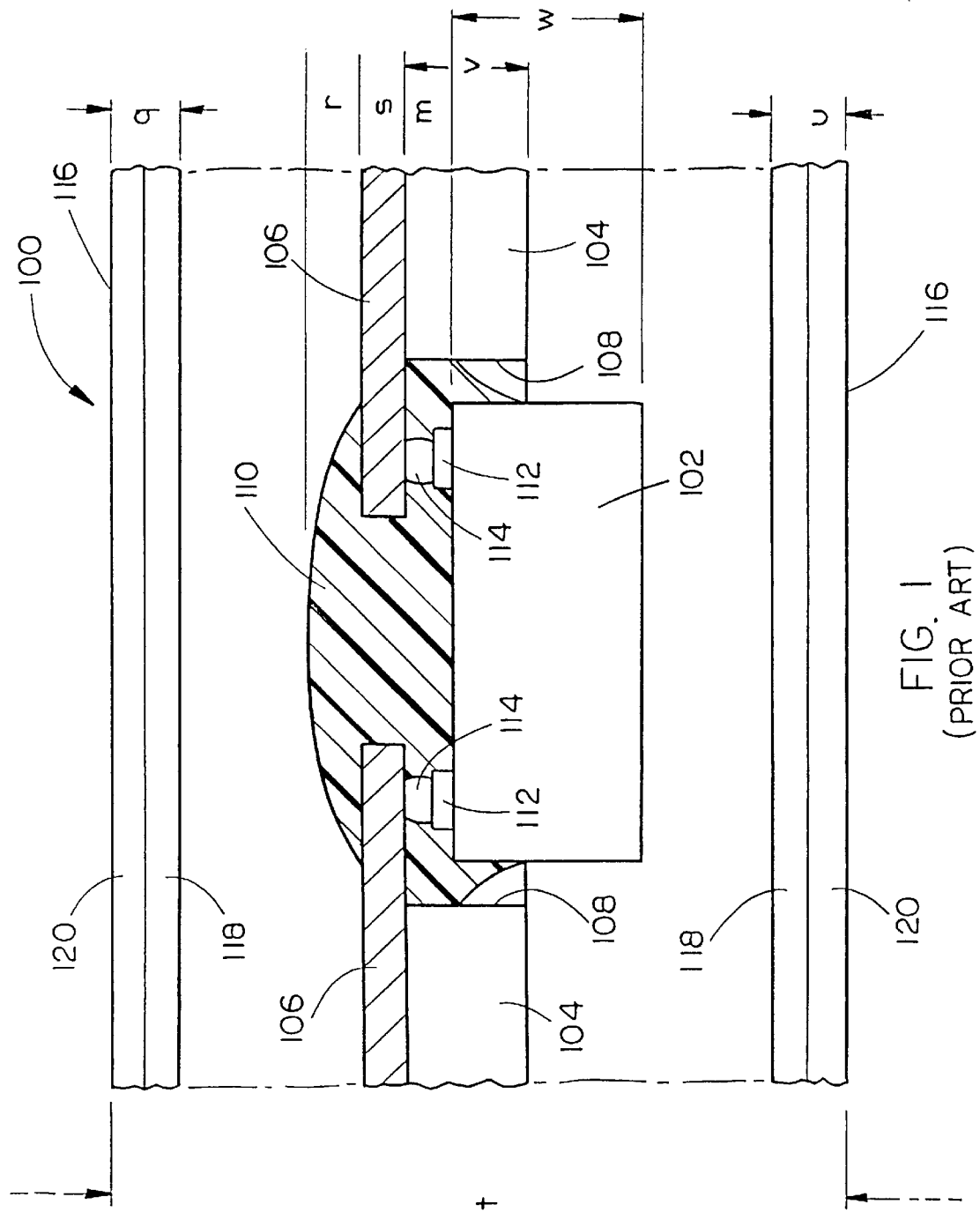
FIG. 1 is a cross-sectional side elevational view showing a typical prior art thin RFID tag.
Figure 2:
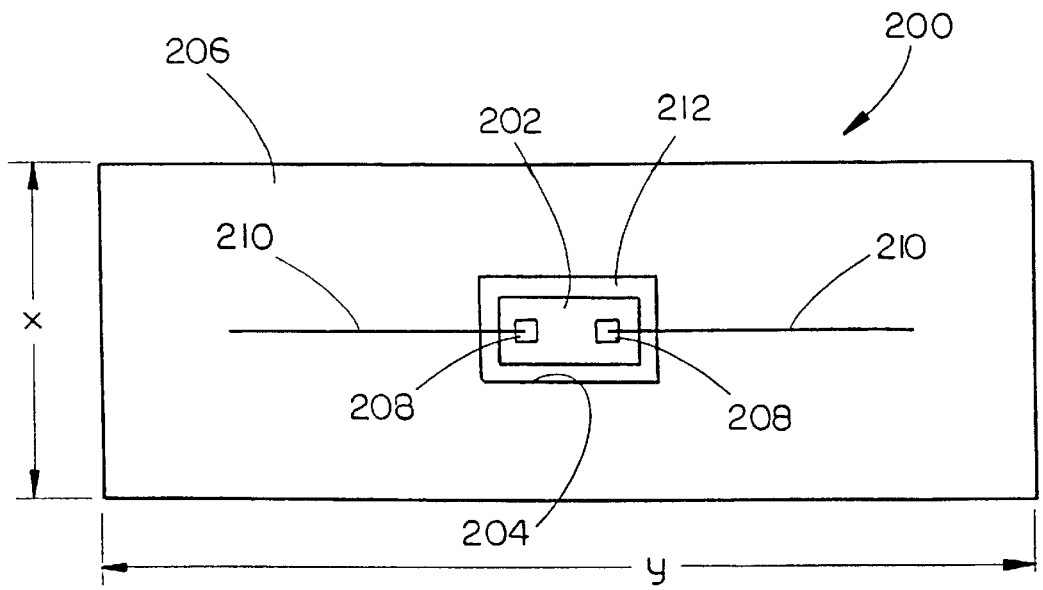
FIG. 2 is a top plan view of a thin, flexible RFID tag having a dipole antenna.

Referring now to FIG. 2, a thin, flexible RFID tag having a single dipole antenna is shown. The RFID tag 200 includes a semiconductor circuit chip 202 having an RF modulator circuit, logic circuits, and memory circuits. The circuit chip 202 is located within a window or aperture 204 disposed in a flexible substrate 206 so that the thickness of the substrate 206 is not added to the thickness of the circuit chip 202. The aperture 204 may be formed in the substrate 206 by conventional means such as etching or punching.

The circuit chip 202 includes contacts 208 which are connected to an antenna 210 contained on the substrate 206. An encapsulant 212 such as an epoxy resin "Glob Top" (i.e., Dexter Hysol FP4323), or the like, may be deposited in a thin layer on the chip 202 within the window 204 to hold the chip 202 therein and protect the chip 202 and bonds between the antenna 210 and contacts 208 from damage due to environmental exposure. The encapsulant may include opaque materials to protect light sensitive circuits on the chip 202.

Figure 3:
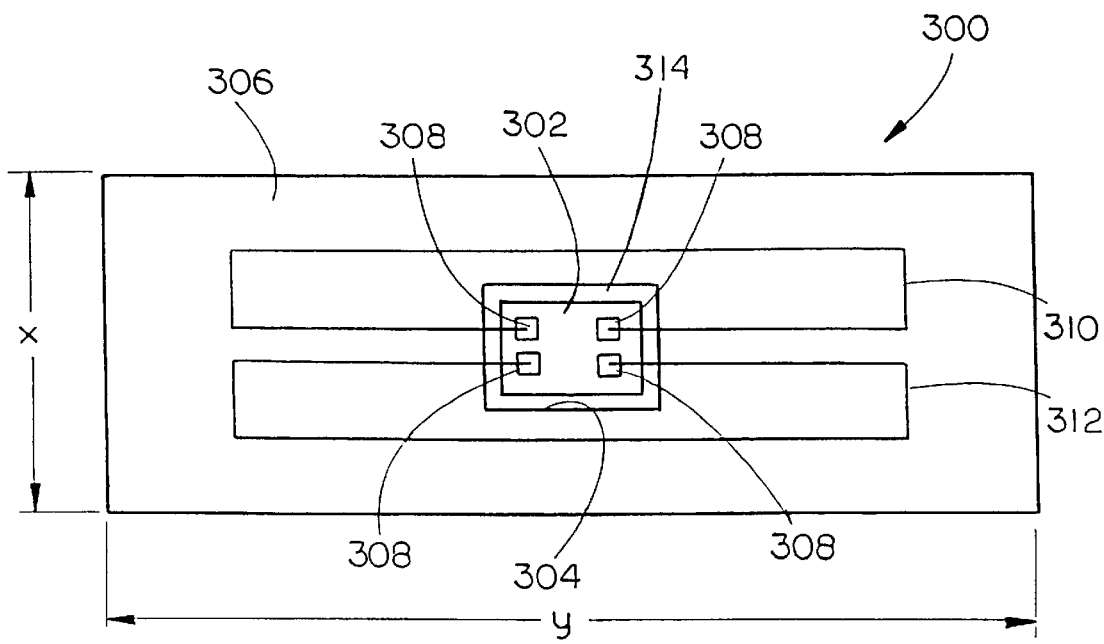
FIG. 3 is a top plan view of a thin, flexible RFID tag having two or more folded dipole antennas.

Referring now to FIG. 3, a thin, flexible RFID tag having two or more folded dipole antennas is shown. The RFID tag 300 includes a semiconductor circuit chip 302 having RF modulator circuits, logic circuits, and memory circuits. The circuit chip 302 is located within a window or aperture 304 disposed in a flexible substrate 306. Preferably, the circuit chip 302 includes multiple sets of contacts 308, each of which may be connected to a folded dipole antenna 310 & 312 contained on the substrate 306. An encapsulant 314 such as an epoxy resin "Glob Top" (i.e., Dexter Hysol FP4323), or the like, may be deposited in a thin layer on the circuit chip 302 within the aperture 304 to hold the chip 302 therein and protect the chip 302 and bonds between the antennas 310 & 312 and contacts 308 from damage due to environmental exposure. The encapsulate 314 may include opaque materials to protect light sensitive circuits on the chip 302 if necessary.

Figure 4:
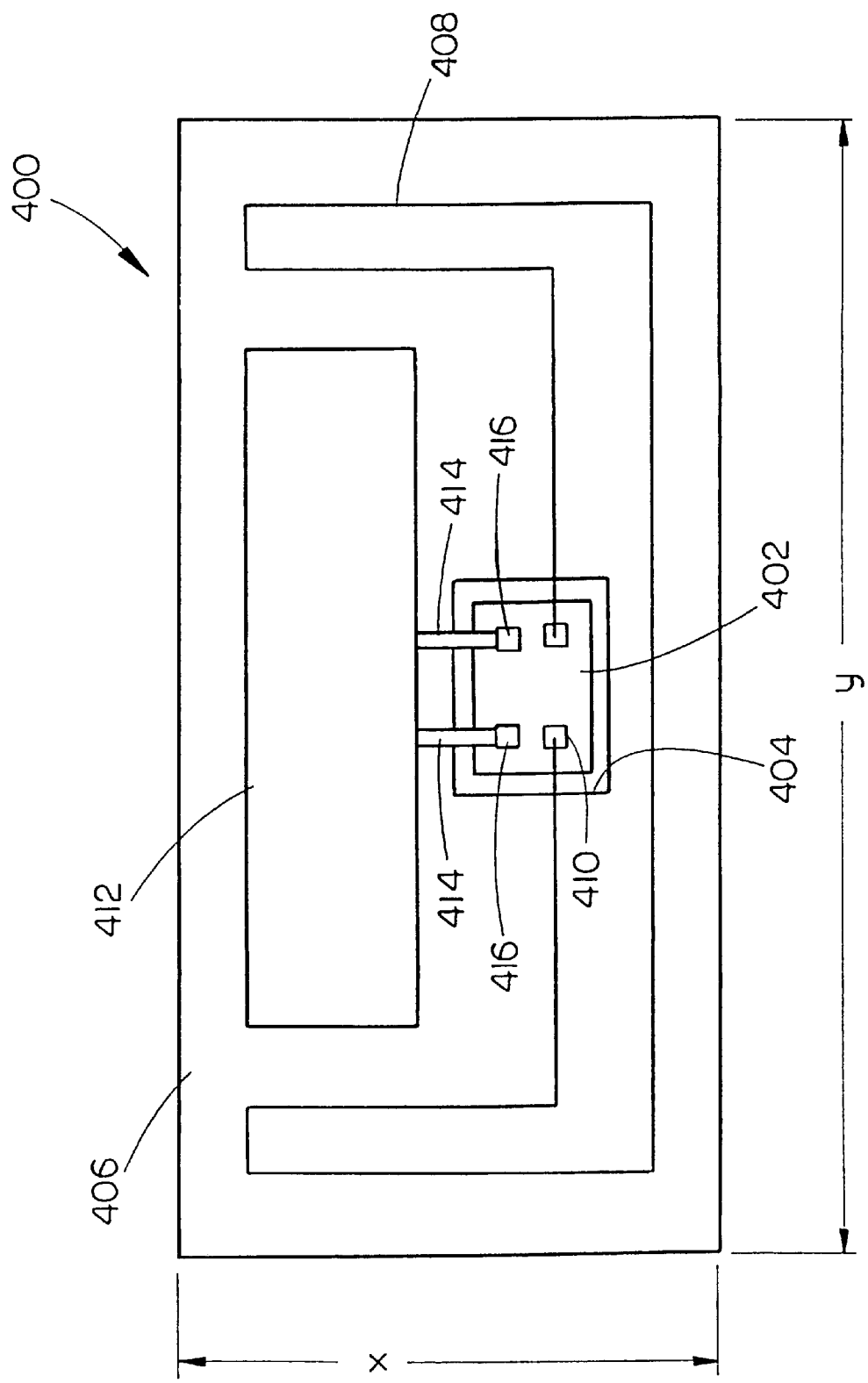
FIG. 4 is a top plan view of a thin, flexible RFID tag having a folded dipole antenna and a battery.

Turning now to FIG. 4, a thin RFID tag having a folded dipole antenna and a thin battery is shown. The RFID tag 400 includes a semiconductor circuit chip 402 having an RF modulator circuit, logic circuits, and memory circuits which is located within a window or aperture 404 disposed in a flexible substrate 406. The circuit chip 402 includes contacts 410 which are connected to a folded dipole antenna 408 contained on the substrate 406.

A thin battery 412 is connected to the circuit chip 402 by leads 414 bonded to contacts 416. The leads 414 provide electrical continuity between the battery 412 and the circuit chip 402. Preferably, the battery 412 is positioned adjacent to the chip 402 on the substrate 406 (not stacked upon the chip 402). In this manner, the thickness of the battery 412 is not added to the thickness of the circuit chip 402. Further, the battery 412 may be placed in a second aperture or cavity disposed in the substrate 402 so that the thickness of the battery does not unnecessarily add to the thickness of the RFID tag 400. In an exemplary embodiment, the battery 412 may have a thickness of approximately 250 microns or less so that it does not substantially reduce the flexibility of the substrate 406.

An encapsulant 418 such as an epoxy resin "Glob Top" (i.e., Dexter Hysol FP4323), or the like, may be deposited in a thin layer on the chip 402 within the aperture 404 to hold the chip 402 therein and protect the chip 402 and bonds between the antenna 408, leads 414 and contacts 410 & 416 from damage due to environmental exposure. The encapsulant may include opaque materials to protect light sensitive circuits on the chip 402.

Preferably, the RFID tags 200, 300 & 400 shown in FIGS. 2, 3 and 4 respectively, have width (x) and length (y) dimensions which allow the tags to be embedded within laminated and printed paper or plastic forms, labels or tags. For example, the length (y) of the RFID tag may correspond to the width of a conventional airline luggage label. Similarly, the width (x) of the RFID tag may correspond to the width of an area of the luggage label which does not receive printed indicia such as a bar code or airport identification code (see FIG. 17B). In this manner, the RFID tag may be embedded within the label in an area where the label will not receive printed indicia. This positioning is preferable since the force of the printer head against the label could potentially damage the RFID tag. It will be apparent to those skilled in the art that RFID tags may be made having width (x) and length (y) dimensions substantially larger or smaller depending on the particular application for which the RFID tag is to be used.

Figure 5:
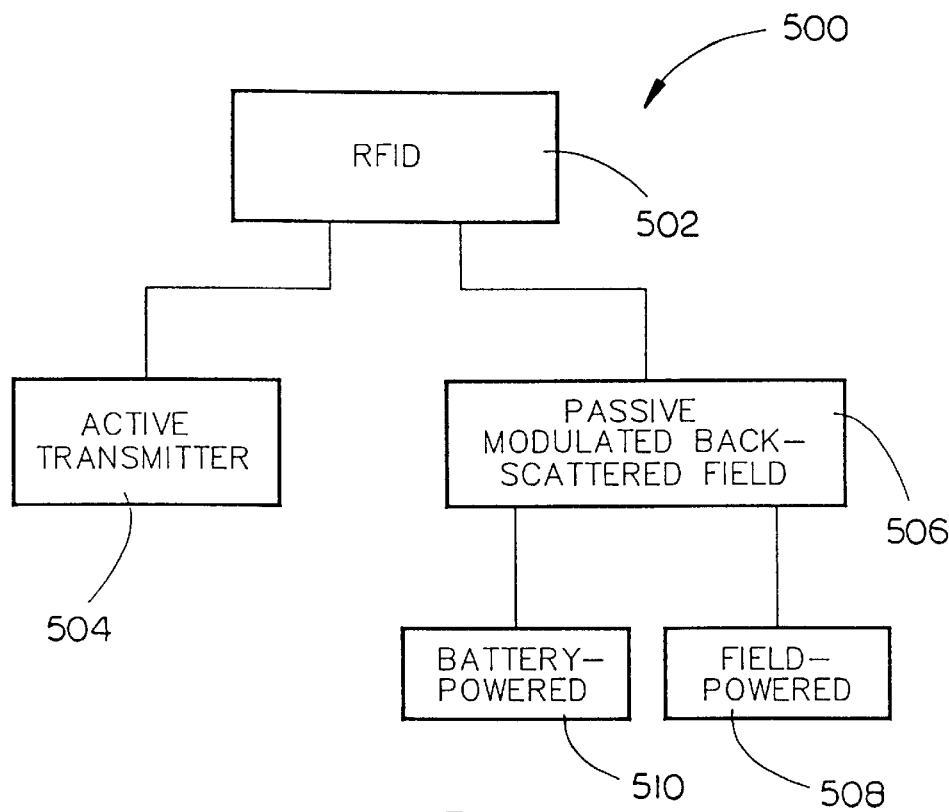
FIG. 5 is a block diagram of a thin, flexible RFID tag.

Referring now to FIG. 5, a block diagram depicting a typical RFID system is shown. RFID tags 502 used by the RFID system 500 comprise either active tags 504 having an internal transmitter, or passive tags 506 which use a modulated back scattered field to provide a return signal to the RF tag reading unit or transceiver 600 (see FIG. 6). Passive RFID tags 506 may be field powered 508, or alternatively, may be at least partially battery powered 510. Field powered RFID tags 508 collect power from the RF field generated by the RF reading unit and convert the collected power to a dc voltage which is stored in a capacitor to provide power for operating the other circuitry of the tag.

Figure 6:
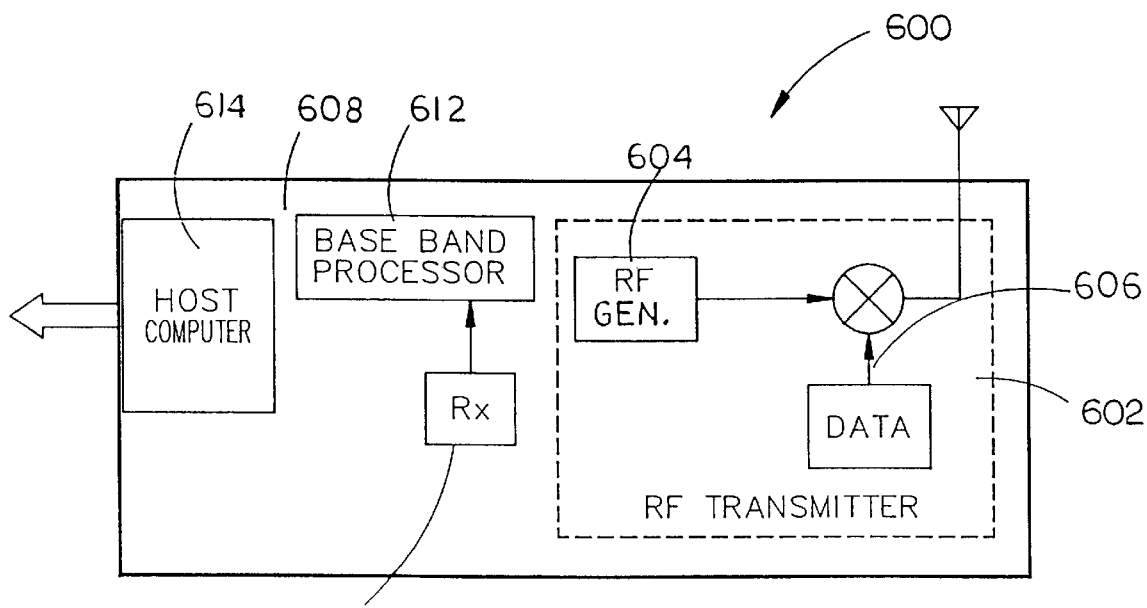
FIG. 6 is a block diagram of a RFID system transceiver.

Turning now to FIG. 6, a typical RFID transceiver for reading information from or writing information to RFID tags is shown. The transceiver assembly 600 may be fixedly mounted (see FIG. 18C), or, alternatively may be at least partially contained within a hand-held device. The RFID transceiver 600 may comprise an RF transmitter 602 and receiver 608 assemblies. The RF transmitter assembly 602 preferably includes an RF wave generator 604 and data modulator 606 for generating an RF interrogating field. The interrogating field may be received by an RFID tag or transponder (not shown) whereupon it is modulated and reflected back to the RFID transceiver 600.

The RF receiver assembly 608 preferably includes a receiver 610 and a base band processor 612 for receiving and processing modulated signals received from RFID tags. An interface 614 provides communication of information received from the RFID tags with a host computer or processor. The interface 614 may also receive information from the host computer to be written to the RFID tag via the RF transmitter assembly 602.

Figure 7A:
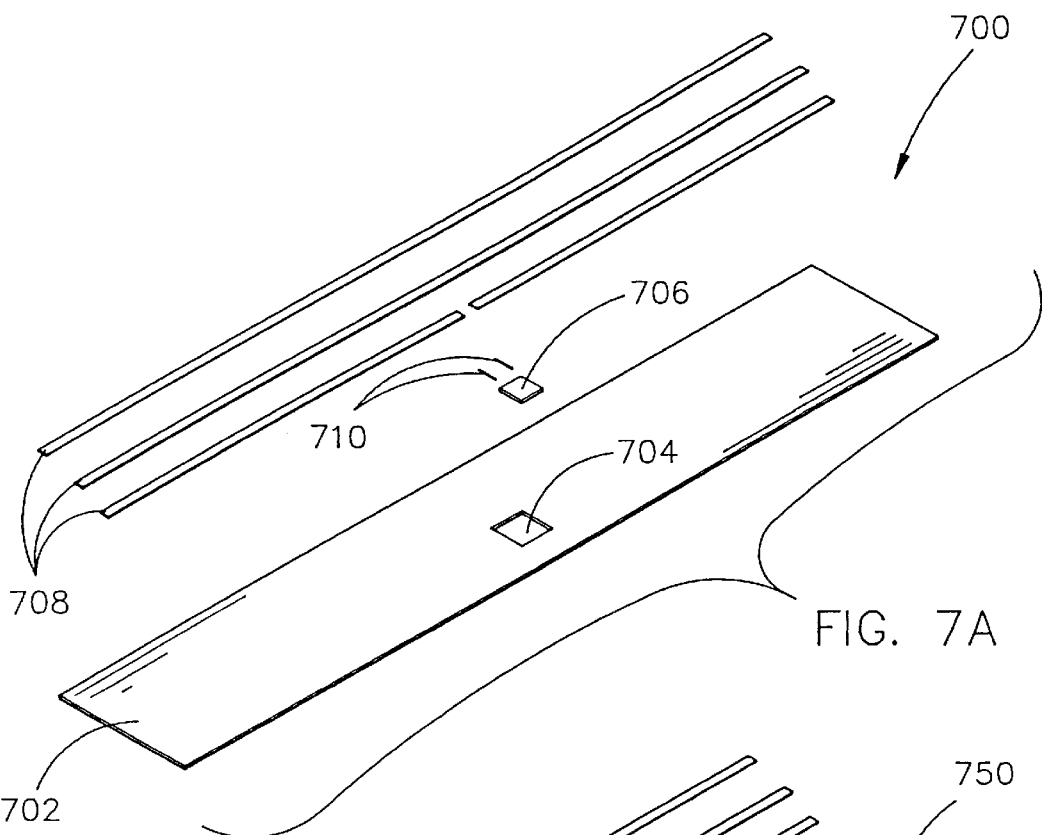
FIGS. 7A and 7B are exploded views depicting elements of thin, flexible RFID tags manufactured in accordance with exemplary embodiments of the present invention.

Referring now to FIG. 7A, elements of a thin flexible RFID tag in accordance with an exemplary embodiment of the present invention are shown. The RFID tag 700 comprises an insulating, flexible substrate 702 made of a circuit board material such as FR-4 grade glass epoxy or the like. Preferably, the substrate 702 has a thickness not exceeding approximately 200 microns. An aperture 704 may be formed in the substrate 702 for receiving an RFID circuit chip 706 so that the circuit chip is substantially and operably located within the aperture 704. The circuit chip 704 preferably includes a modulator circuit, a logic circuit, a memory circuit, and a chip antenna connector (not shown).

To maintain thinness of the RFID tag package, the circuit chip 702 may be thinned to have a thickness not exceeding approximately 200 microns (i.e., approximately equal to the thickness of the substrate 702). Thus, when the circuit chip 706 is placed within the substrate aperture 704, the upper and lower surfaces of the circuit chip 706 are substantially co-planer with the respective upper and lower surfaces of the substrate 702. Thinning of the circuit chip 706 may be accomplished by polishing or back grinding of the semiconductor wafer from which the circuit chip is manufactured so that its thickness (and thus the thickness of the finished circuit chip 706) is reduced to less than approximately 200 microns.

An antenna 708 is coupled to the circuit chip 704 via connectors 710. The antenna 702 is preferably a resonant antenna having, for example, a dipole, folded dipole, loop, or meander structure (a dipole structure is shown). Such antenna structures typically occupy a single plane and are preferred over multi-loop structures which require cross-overs for connections. Such cross-overs add to the overall thickness of the antenna 708. Further, one or more impedance adjustment elements 712 may be integrally formed on the substrate 702 for modifying the impedance of the antenna 708. The impedance adjustment elements 712 may be parasitic (i.e., not electrically connected to the dipole structure). Preferably, the antenna 702 and impedance adjustment elements 712 comprise thin, approximately 25 to 35 micron thick, lines of a metallic substance integrally formed on the substrate 702. In an exemplary embodiment, the metallic lines of the antenna 708 may be formed by adhering a thin layer of 0.5 oz. copper to the substrate 702 with an adhesive such as butyral phenolic adhesive, silicon adhesive, or the like. This copper layer may then be etched to form the antenna 708. The copper may be electroplated with thin layers of nickel and gold to facilitate bonding of connectors 710 to the antenna 708, and to prevent corrosion due to environmental exposure.

Connectors 710 electrically connect the antenna 708 to the antenna contacts of the circuit chip 706. Preferably, the connectors 710 are made using low profile wire bonding techniques. However, other bonding techniques such as conventional wire bonding, thermal compression, single point bonding, C4 bonding, and conductive adhesive may be used. An encapsulant (see FIG. 10D) operably retains the circuit chip 706 within the substrate aperture 704. Preferably, the cured encapsulant forms an at least somewhat flexible bond between the circuit chip 706 and the antenna to chip connectors 710.

Figure 7B:
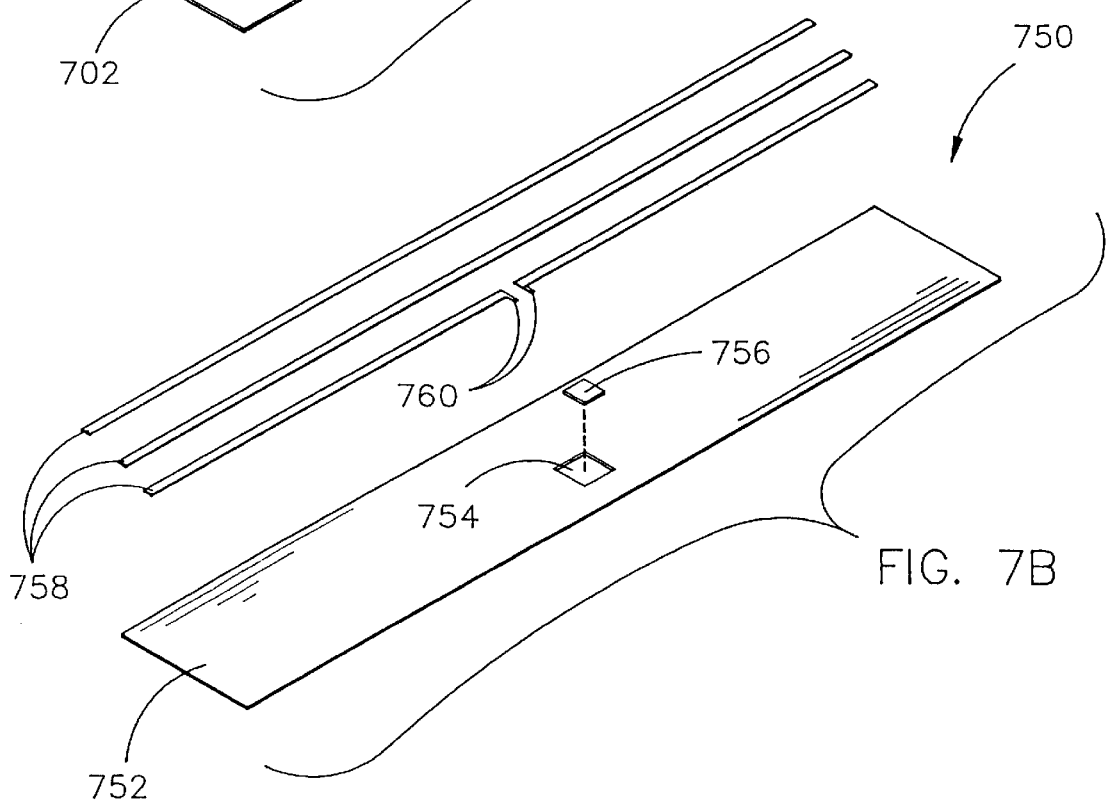

Referring now to FIG. 7B, components of a thin, flexible RFID tag in accordance with an alternative embodiment of the present invention are shown. Like the embodiment 700 shown in FIG. 7A, the RFID tag 750 shown in FIG. 7B comprises an insulating, flexible substrate 752. However, the substrate 758 is made of an organic substance such as polyimide, polyester, or the like instead of circuit board material. An aperture 754 is formed in the substrate 752 for receiving an RFID circuit chip 756 so that the circuit chip is substantially and operably located within the aperture 754. The circuit chip 754 preferably includes an RF modulator circuit, a logic circuit, a memory circuit, and a chip antenna connector (not shown). To maintain thinness of the RFID tag package, the circuit chip 752 is made to have a thickness not exceeding approximately 200 microns. This may be accomplished by thinning the circuit chip 706 by polishing or back grinding as described, supra, in connection with FIG. 7A.

An antenna 758 is integrally formed on the substrate 752 and coupled to the circuit chip 754. The antenna 758 is preferably a resonant antenna having, for example, a dipole, folded dipole, loop or meander structure (a dipole structure is shown). One or more impedance adjustment elements 762 may be integrally formed on the substrate 752 to modify the impedance of the antenna 758. The impedance adjustment elements 762 may be parasitic. Preferably, the antenna 758 comprises thin, approximately 25 to 35 micron thick, metallic (i.e., copper) lines integrally formed on the substrate 752. In an exemplary embodiment, a thin layer of 0.5 oz. copper may be adhered to the substrate 752 with an adhesive such as butyral phenolic adhesive, silicon adhesive, or the like. This copper layer may then be etched in the pattern of the antenna 758. The copper may be electroplated with thin layers of nickel and gold to facilitate bonding of the antenna 758 to the circuit chip 754, and to prevent corrosion of the copper due to environmental exposure.

Ends 760 of the antenna 758 may be cantilevered over the substrate aperture 756 to electrically connect the antenna 758 to the antenna connector of the circuit chip 756. The antenna connectors of the circuit chip 756 preferably comprise bumps (see FIG. 12B through 12F) on the chip 756. The bumps may be, for example, either plated gold bumps for thermocompression bonding or C4 solder bumps for solder bonding. Preferably, the bumps have a thickness of approximately 100 microns or less, and thus will not degrade electrical performance of the RFID tag 750 by introducing unwanted inductance into the antenna circuit. An encapsulant (see FIGS. 12D through 12F) operably retains the circuit chip 756 within the substrate aperture 754. Preferably, the encapsulant forms an at least somewhat flexible bond between the circuit chip 756 and the cantilevered ends 760 of the antenna 758.

Figure 8A:
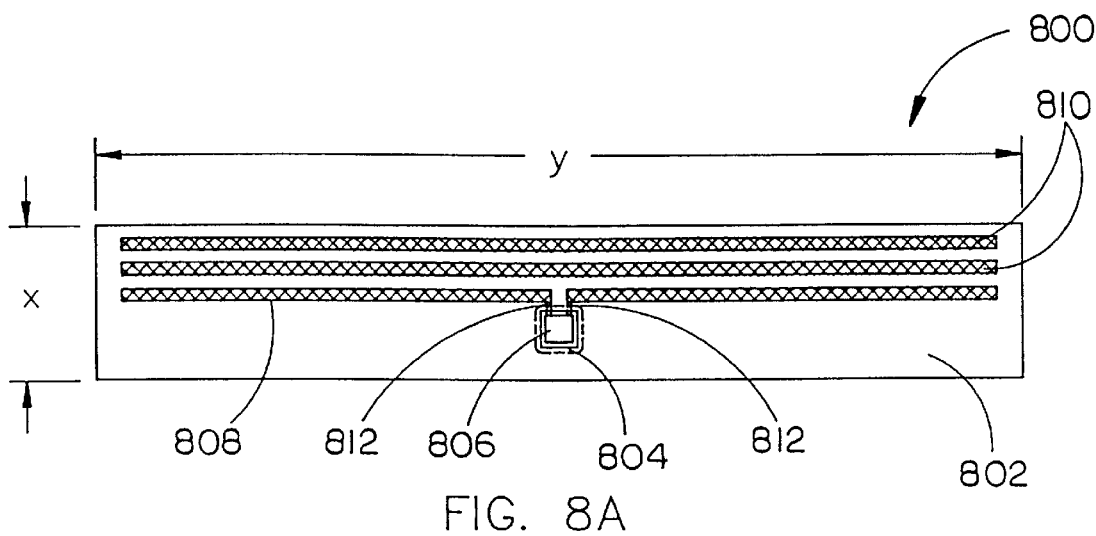
FIGS. 8A and 8B are top plan views of thin, flexible RFID tags having simple dipole and folded dipole antenna structures.
Figure 8B:
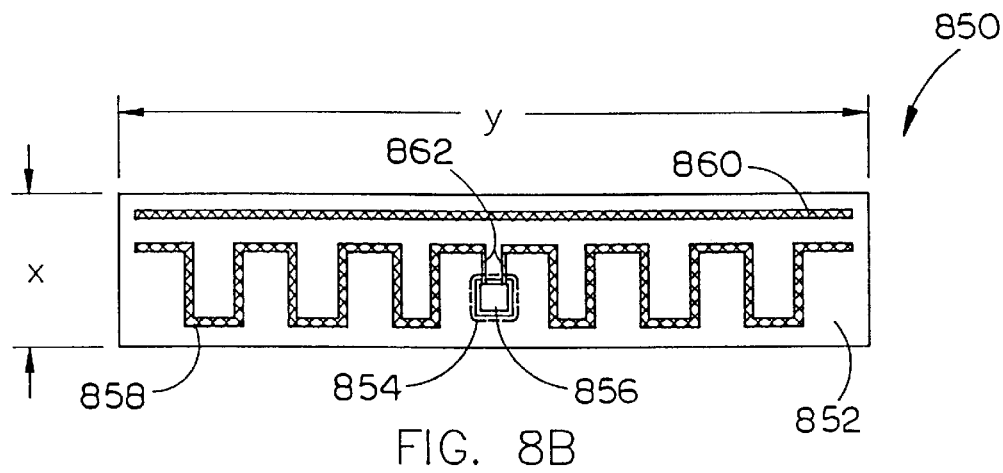

Referring now to FIGS. 8A and 8B, thin, flexible RFID tags in accordance with exemplary embodiments of the present invention are shown. Each RFID tag 800, 850 comprises an insulating, flexible substrate 802, 852 having width (x) and length (y) dimensions which allow it to be embedded within laminated and printed paper or plastic forms, labels or tags, as discussed, supra, in connection with FIGS. 2 through 4.

An RFID circuit chip 806, 856 is substantially and operably located within an aperture 804, 854 formed within the substrate 802, 852. The circuit chip 806, 856 preferably includes an RF modulator circuit, a logic circuit, a memory circuit, and an chip antenna connector (not shown). An antenna 808, 858 is coupled to the circuit chip 806 via connectors 812. The antenna 808 is preferably a resonant antenna and may have a dipole structure (antenna 808 (FIG. 8A)) or a meander (half wavelength) structure (antenna 858 (FIG. 8B)). An advantage of the meander structure of antenna 858 shown in FIG. 8B is that the overall length (y) of the RFID tag may be greatly reduced (by as much as one half the length (y) of the simple dipole antenna 808 shown in FIG. 8A). One or more impedance adjustment elements 810, 860 may be integrally formed on the substrate 802, 852 adjacent to the antenna 808, 858 to modify the impedance of the antenna 808, 858. Connectors 812, 862 electrically connect the antenna 808, 858 to the antenna connectors of the circuit chip 806, 856. Preferably, the connectors 812, 862 are made using low profile wire bonding techniques. Alternatively, other bonding techniques such as conventional wire bonding, thermal compression, single point bonding, C4 bonding, and conductive adhesive may be used. An encapsulant (see FIG. 10D) operably retains the circuit chip 806, 856 within the substrate aperture 804, 854. Preferably, the cured encapsulant encapsulates the circuit chip 806, 856 and antenna and chip connectors 812, 862 within the substrate aperture 804, 854 and forms an at least somewhat flexible bond between the circuit chip 806, 856 and the antenna and chip connectors 812, 862.

Figure 9:
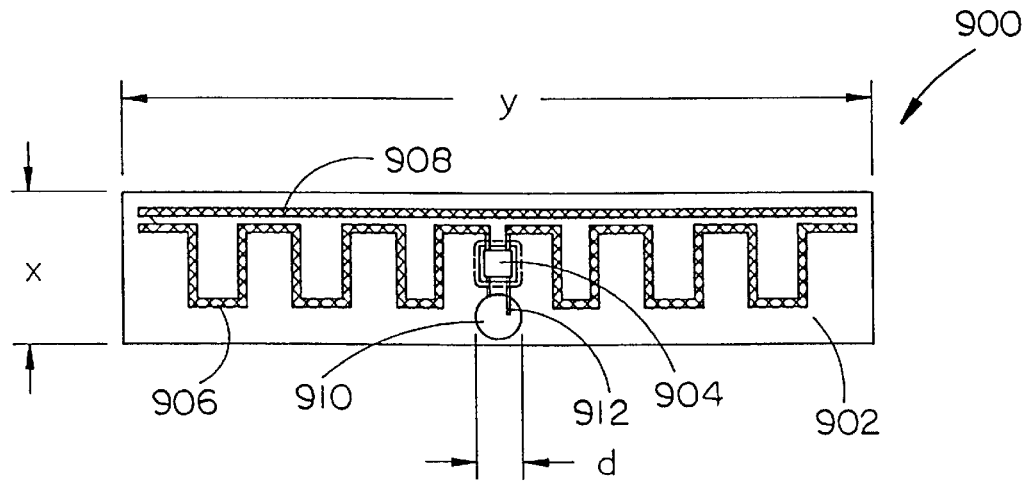
FIG. 9 is a top plan view of a thin, flexible RFID tag having an integral battery.

Referring now to FIG. 9, a thin, flexible RFID tag having an integral battery is shown. The RFID tag 900 comprises an insulating, flexible substrate 902 having width (x) and length (y) dimensions which allow it to be embedded within laminated and printed paper or plastic forms, labels or tags, as discussed, supra, in connection with FIGS. 2 through 4. An RFID circuit chip 904 is substantially and operably located within the aperture formed within the substrate 902. The circuit chip 906 preferably includes an RF modulator circuit, a logic circuit, a memory circuit, and chip antenna connectors (not shown). A resonant antenna 906 having a meander structure is coupled to the circuit chip 904. One or more impedance adjustment elements 908 sized and positioned to adjust the impedance of the antenna 906 may be integrally formed on the substrate 902 adjacent to the antenna 906. A battery 912 is affixed to the substrate 902 adjacent to the antenna 906 and circuit chip 904. The battery 910 may, for example, be inserted in a second cavity or aperture formed in the substrate 902 so that the thickness of the battery 910 is not unnecessarily added to the thickness of the substrate 902. This cavity may have a diameter (d) corresponding to the diameter of the battery 910. The battery 912 may be connected to the circuit chip 904 by one or more battery connecting lines 912 to two or more chip battery contacts disposed on the surface of the circuit chip 904. Preferably, the chip battery contacts are coplanar with the antenna 906 and connecting lines 912 thereby reducing the thickness of the RFID tag package. The short length of the battery connecting lines 912 provides electrical continuity between the battery 910 and the circuit chip 904. The connecting lines 912 may be bonded to the battery contacts and circuit chip battery contacts using conventional bonding techniques such as, for example, low profile wire bonding, wire bonding, thermal compression (TC), single point bonding, C4 bonding, soldering, spot welding, or conductive adhesive. An encapsulant (see FIG. 10D) may be applied and cured to operably retain the circuit chip 904 within the substrate aperture. Preferably, the cured encapsulant encapsulates the circuit chip 904 and forms an at least somewhat flexible bond between the circuit chip 904 and the antenna 906.

Referring now to FIGS. 10A through 10D, assembly of a thin, flexible RFID tag having a "chip-in-board" construction in accordance with an exemplary embodiment of the present invention is illustrated.

Figure 10A:
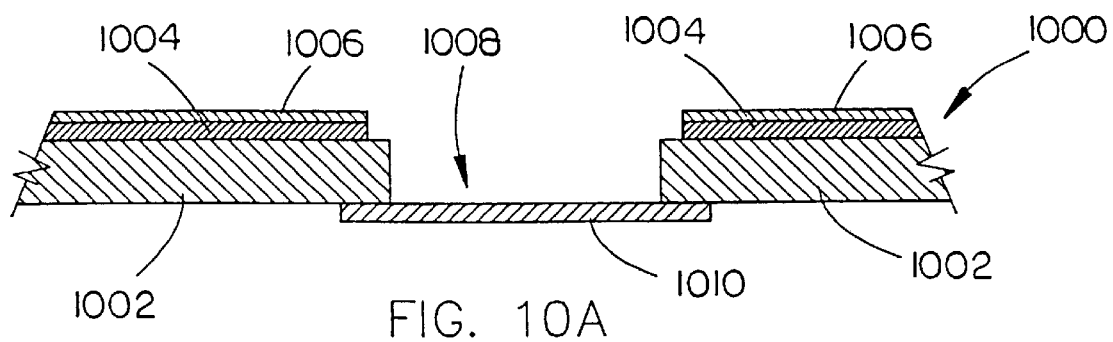
FIGS. 10A through 10D are cross-sectional side elevational views depicting the assembly of an RFID tag having a "chip-in-board" construction in accordance with the present invention.

As shown in FIG. 10A, the RFID tag 1000 comprises an insulating, flexible substrate 1002. This substrate 1002 may be made of fire-resistant circuit board material such as FR-4 grade glass epoxy resin or the like, having a thickness not exceeding approximately 200 microns. An aperture 1008 may be formed in the substrate 1002 (i.e., via etching, punching, etc.). Thin, approximately 25 to 35 micron thick metallic (i.e., copper) lines 1004 may be formed on the substrate 1002 to form an antenna. Preferably, the antenna lines 1004 may be formed by adhering a thin layer of copper onto the substrate and etching the copper in the pattern of the antenna. The copper antenna lines 1004 may be electroplated with thin layers of a second metal such as gold or nickel (not shown) to facilitate bonding of wire connectors 1016 to the antenna lines 1004 and to protect the copper from corrosion. Preferably, this gold or nickel layer does not exceed approximately 0.5 microns in thickness. A solder mask 1006 may then be formed on the substrate 1002 and antenna lines 1006. The solder mask 1006 protects the copper of the antenna lines 1006 during later manufacturing steps. A backing material 1010 (i.e., polyimide tape) may be adhered to the bottom surface of the substrate 1002 over the substrate aperture 1008, or, alternatively, the substrate 1002 may be secured to a flat surface (not shown) to form a chip support platform for receiving a circuit chip.

Figure 10B:
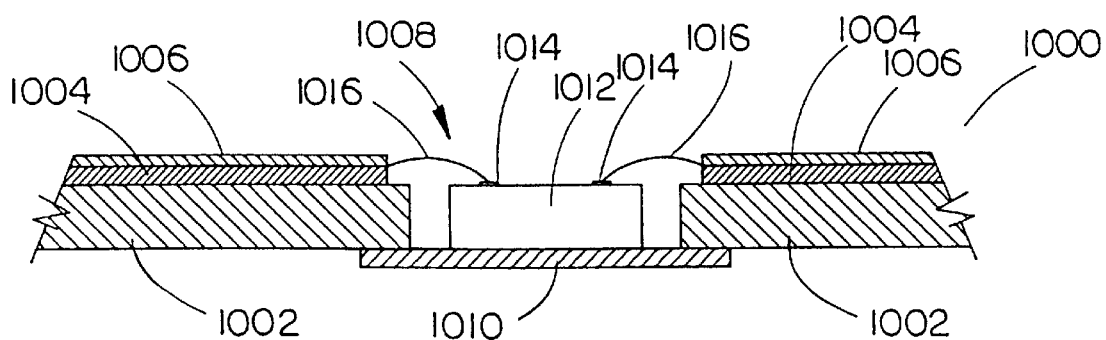

Turning now to FIG. 10B, an RFID circuit chip 1012 is placed within the substrate aperture 1008 onto the chip support platform so that an annular space is formed between the chip 1012 and the aperture's walls. Preferably, the circuit chip 1012 comprises RF circuitry including, for example, a modulator circuit, a logic circuit, and a memory circuit. To maintain thinness of the RFID tag package, the circuit chip 1002 may be made to have a thickness not exceeding approximately 200 microns e.g., approximately equal to the thickness of the substrate 1002) so that the upper and lower surfaces of the circuit chip 1012 are substantially co-planer with the respective upper and lower surfaces of the substrate 1002 when the chip 1012 is placed within the aperture 1008. As discussed in connection with FIG. 7A, supra, this is preferably accomplished by thinning the circuit chip 1012 via polishing or back grinding. The circuit chip 1010 may then be electrically connected to the copper antenna lines 1006 via antenna contacts 1014 disposed on the upper surface of the chip 1010. Bonding of the copper antenna lines 1006 to the antenna contacts 1014 may be accomplished by connectors 1016. Preferably, the connectors 1016 are made using low profile wire bonding techniques. However, other bonding techniques such as conventional wire bonding, thermal compression, single point bonding, C4 bonding, and conductive adhesive may be used. The solder mask 1006 protects the copper antenna lines 1004 while the connectors 1014 are secured to the copper antenna lines 1004 and antenna contacts 1014 of the circuit chip 1012.

Figure 10C:
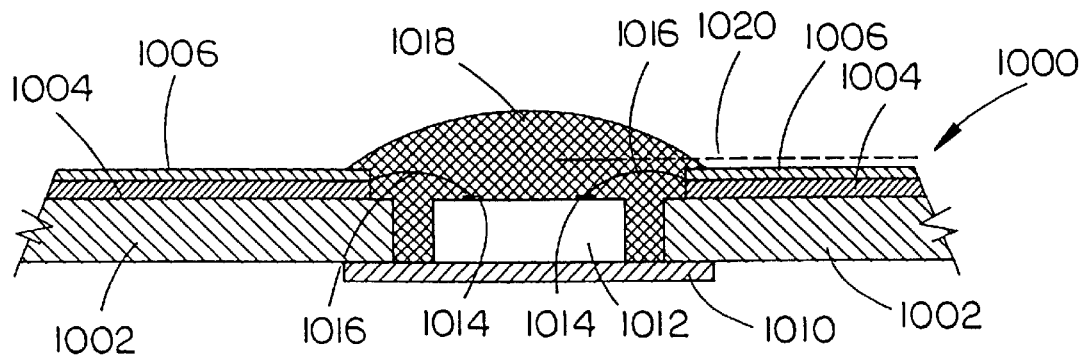

As shown in FIG. 10C, an encapsulant 1018 is applied over the circuit chip 1010, connectors 1014, and at least a portion of the copper antenna lines 1006 and cured. The cured encapsulant 1018 forms a generally globular structure which encapsulates and operably retains the circuit chip 1010 and connectors 1016 within the substrate aperture 1008 and provides an at least somewhat flexible bond between the circuit chip 1010 and the connectors 1016 and the connectors 1016 and the copper antenna lines 1004. The encapsulant 1018 may be an epoxy resin "Glob Top" such as Dexter Hysol FP4323 or the like which may be deposited in a thin layer within the substrate aperture 1008 to hold the circuit chip 1012 therein and protect the circuit chip 1012 and connectors 1014 from damage due to environmental exposure. Preferably, the encapsulant 1018 does not substantially reduce the overall flexibility of the RFID tag about more than one axis. The encapsulant 1018 may include opaque materials to protect light sensitive circuits on the circuit chip 1012.

Figure 10D:
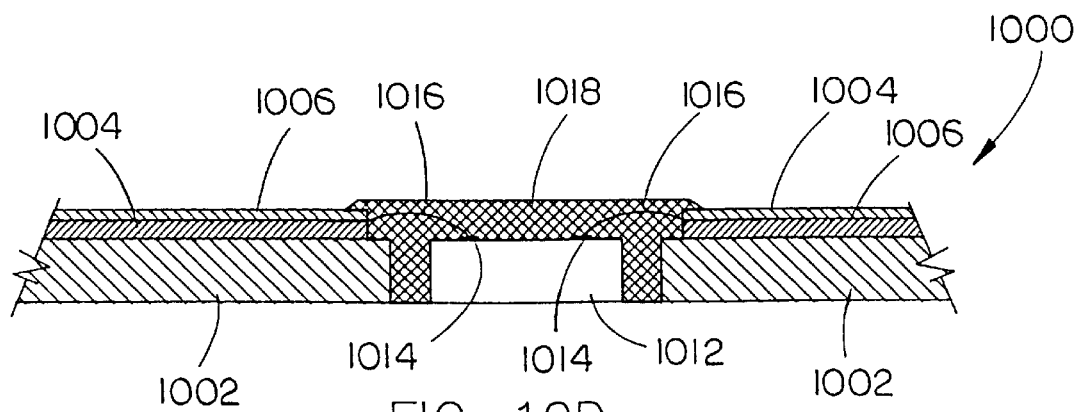

As shown in FIGS. 10C and 10D, the overall cross-sectional thickness of the encapsulant 1018 may be reduced so that the cross-sectional profile thickness of the RFID tag 1000 is not unnecessarily increased. Preferably, the upper generally spherical surface of the encapsulant 1018 may be milled after curing so that the finished encapsulant 1018 includes a portion (indicated by line 1020 in FIG. 10C) which is substantially parallel with the upper surface of the substrate 1002. In this manner, the finished encapsulant 1018 is thinned so that it does not increase the overall thickness of the substrate by more than approximately 90 microns.

As shown in FIG. 10D, the backing tape 1010 may be removed from the substrate 1002 (or, alternatively, the substrate may be removed from the flat surface (not shown)). Preferably, the encapsulant 1018 will have filled the annular space around the circuit chip to form a surface which is substantially co-planar with the lower surface of the substrate 1002. The solder mask 1006 is preferably left on the finished RFID tag 1000 to provide a protective layer covering the copper antenna lines during the tag's use.

Preferably, the overall thickness of the finished RFID tag 1000 (shown in FIG. 10D) does not exceed approximately 280 microns. This allows the RFID tag 1000 to be embedded in thin labels or laminated and printed forms. Such "smart" labels may be employed as luggage or shipping tags typically used by airlines or other shippers to track the transportation of luggage and other packages or objects. Similarly, RFID tags 1000 may be embedded within wristband identification bracelets typically used for tracking the movement patients in a hospital, or animal collars which may be used for tracking the movement of animals such as household pets, farm animals, or the like. Preferably, the thinness and flexibility of the RFID tags 1000 of the present invention allows such labels to be printed using existing printers without causing excessive wear of the printer's rollers and print head.

Figure 11:
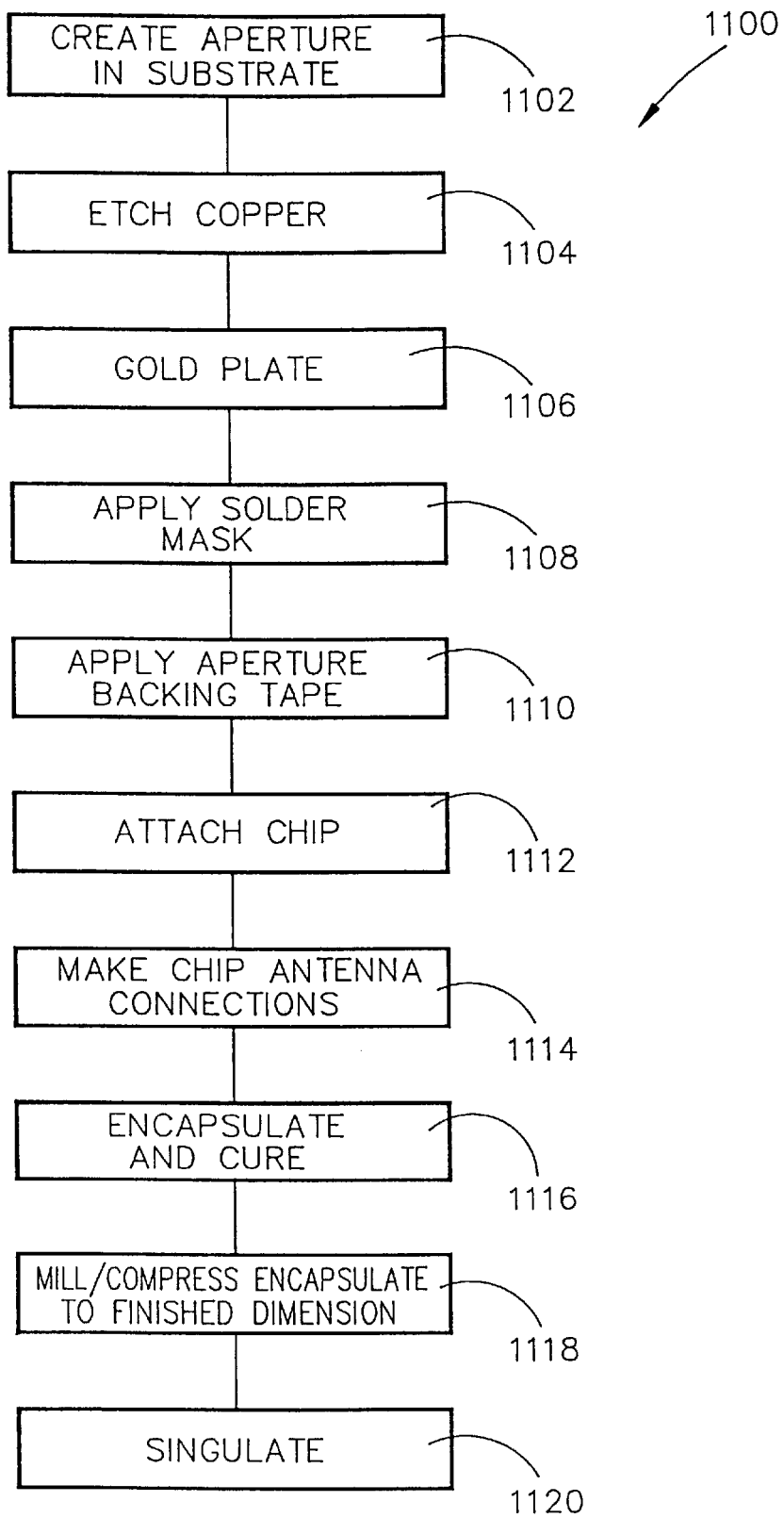
FIG. 11 is a flow diagram illustrating a method of assembling a chip-on-board RFID tag shown in FIGS. 10A though 10D.

FIG. 11 is a flow diagram summarizing the process of assembling an RFID tag such as shown in FIGS. 10A though 10D. The process 1100 is begun by forming or creating an aperture in the insulating thin flexible substrate material at step 1102. A thin sheet (preferably less than 200 microns) of glass epoxy resin circuit board material may have a plurality of apertures punched therein at regular intervals (see FIG. 14). Alternatively, the apertures may be formed by cutting or etching the substrate material. An antenna is formed as an integral part of the substrate at step 1104. This may be accomplished by depositing a thin layer of a metal, preferably copper, onto the substrate and etching the metal to form the pattern of the antenna. The copper antenna may be electroplated with a thin layer of a metal such as gold or nickel at step 1106 to facilitate bonding of wire connectors thereto and to prevent corrosion of the base metal (e.g., copper). The substrate aperture is then backed at step 1108 to form a chip support platform for receiving a circuit chip. This is accomplished by adhering a backing material (i.e., polyimide tape) to the bottom surface of the substrate so that it covers the substrate aperture and forms a cavity in which the chip may be inserted. Alternatively, the substrate may be secured to a flat surface (not shown) thereby forming the cavity. An RFID circuit chip may then be placed on the chip support platform within the substrate aperture at step 1102 to form an annular space between the chip and the substrate aperture walls. Preferably, the chip is centered within the aperture and held securely therein by the backing tape (or, alternatively, by the flat surface). Suction may be applied to the circuit chip to operably register the chip within the substrate aperture. The circuit chip may then be electrically connected with the antenna via one or more connectors at step 1114. Bonding of the connectors to the antenna and chip contacts may be accomplished using low profile wire bonding techniques. Alternatively, other bonding techniques such as conventional wire bonding, thermal compression, single point bonding, C4 bonding, and conductive adhesive may be used. An encapsulant is then applied over the circuit chip, connectors, and at least a portion of the copper antenna lines and cured at step 1116. Preferably, the encapsulant fills the annular space between the circuit chip and the substrate aperture walls to secure the chip within the annular space and protect the chip to antenna electrical connections. After the encapsulant has at least partially cured, the backing material is removed from the substrate. At least one surface of the encapsulant is modified at step 1120 so that the overall thickness of the RFID tag is not unnecessarily increased by the thickness of excess encapsulant. Typically, when the encapsulant is applied it forms a generally globular structure having a generally spherical upper surface. Excess encapsulant may be milled after curing so that the finished encapsulant does not increase the overall thickness of the substrate by more than approximately 90 microns. Finished RFID tags may then be singulated (e.g., punched or cut) from the sheet of substrate at step 1120.

Figure 12:
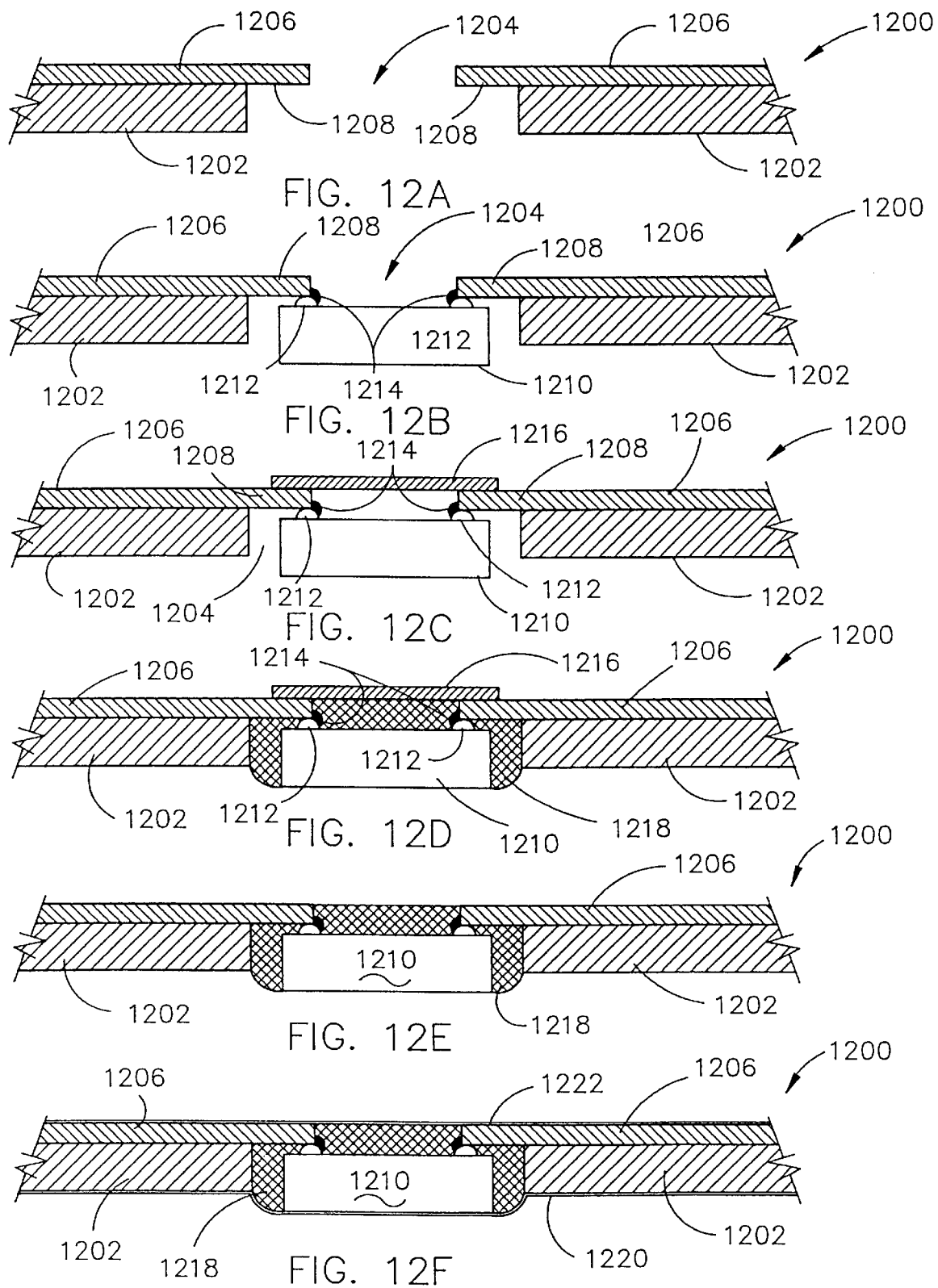
FIGS. 12A through 12F are cross-sectional side elevation views depicting the assembly of a thin RFID tag using a "thin-flex" construction in accordance with an exemplary embodiment of the present invention.

Referring now to FIGS. 12A through 12F, assembly of a thin, flexible RFID tag having a "thin-flex" construction in accordance with an alternative embodiment of the present invention is illustrated. As shown in FIG. 12A, the RFID tag 1200 comprises an insulating, flexible substrate 1202. This substrate 1202 may be made of a flexible organic laminate such as polyimide, polyester, or the like, having a thickness not exceeding approximately 125 microns. An aperture 1204 is formed in the substrate 1202 using conventional means (i.e., etching, cutting, punching, etc.). Thin, approximately 25 to 35 micron thick metallic (preferably copper) lines 1206 may be disposed on the substrate 1202 to form an antenna. In an exemplary embodiment, the antenna lines 1206 may be formed by depositing a thin layer of 0.5 ounce copper onto the substrate and etching the copper in the pattern of the antenna. The copper may be electroplated with thin layers of a second conductive metal such as gold or nickel (not shown) to facilitate bonding of the antenna lines 1206 and to protect the copper from corrosion. Preferably, this gold or nickel layer does not exceed approximately 0.5 microns in thickness.

As shown in FIG. 12B, the RFID circuit chip 1210 is placed within the substrate aperture 1204 so that an annular space is formed between the chip 1012 and the aperture's walls. Preferably, the circuit chip 1210 comprises RF circuitry including, for example, a modulator circuit, a logic circuit, and a memory circuit. To maintain thinness of the RFID tag package, the circuit chip 1210 may be made to have a thickness not exceeding approximately 200 microns.

As discussed in connection with FIG. 7A, supra, this is preferably accomplished by thinning the circuit chip 1210 via polishing or back grinding. Ends 1208 of the antenna lines 1206 may be cantilevered over the substrate aperture 1204 to electrically connect the antenna 1206 to the antenna connectors 1212 of the circuit chip 1210. The antenna connectors 1212 of the circuit chip 1210 preferably comprise bumps on the surface of the chip 1210. The bumps may be, for example, either plated gold bumps for thermocompression bonding or C4 solder bumps for solder bonding. Preferably, the bumps 1212 have a thickness of approximately 100 microns or less, and thus will not degrade electrical performance of the RFID tag 1200 by introducing unwanted inductance into the antenna circuit. A backing material 1216 (i.e., polyimide tape) may be adhered to upper surface of the substrate 1202 and antenna lines 1206 so that it covers the substrate aperture 1204 as shown in FIG. 12C.

As shown in FIG. 12D, an encapsulant 1218 is applied within the substrate aperture 1204 and cured. Preferably, the encapsulant 1218 substantially fills the annular space between the chip 1210 and the aperture's walls to operably retain the circuit chip 1210 within the substrate aperture 1204. The encapsulant 1218 also forms an at least somewhat flexible bond between the circuit chip 1210 and the cantilevered ends 1208 of the antenna lines 1206 and protects the circuit chip 1212 and antenna connections 1214 from damage due to environmental exposure. Preferably, the encapsulant is an epoxy resin "Glob Top" such as Dexter Hysol FP4323 or the like which may include opaque materials to protect light sensitive circuits on the chip 1200.

As shown in FIGS. 12E and 12F, the backing tape 1216 may be removed from the substrate 1202 whereupon the encapsulant 1218 will have filled the annular space around the circuit chip to form a surface which is substantially co-planar with the upper surface of the substrate 1202. A flexible laminate 1220 & 1222 may cover one or both sides of the RFID tag 1200. In an exemplary embodiment, this laminate 1220 & 1222 may consist of a thin inner layer of a soft copolymer such as ethyl-vinyl-acetate (EVA) and an outer layer of a tough polyester (PET) forming the outside surface of the laminate 1220 & 1222.

Figure 13:
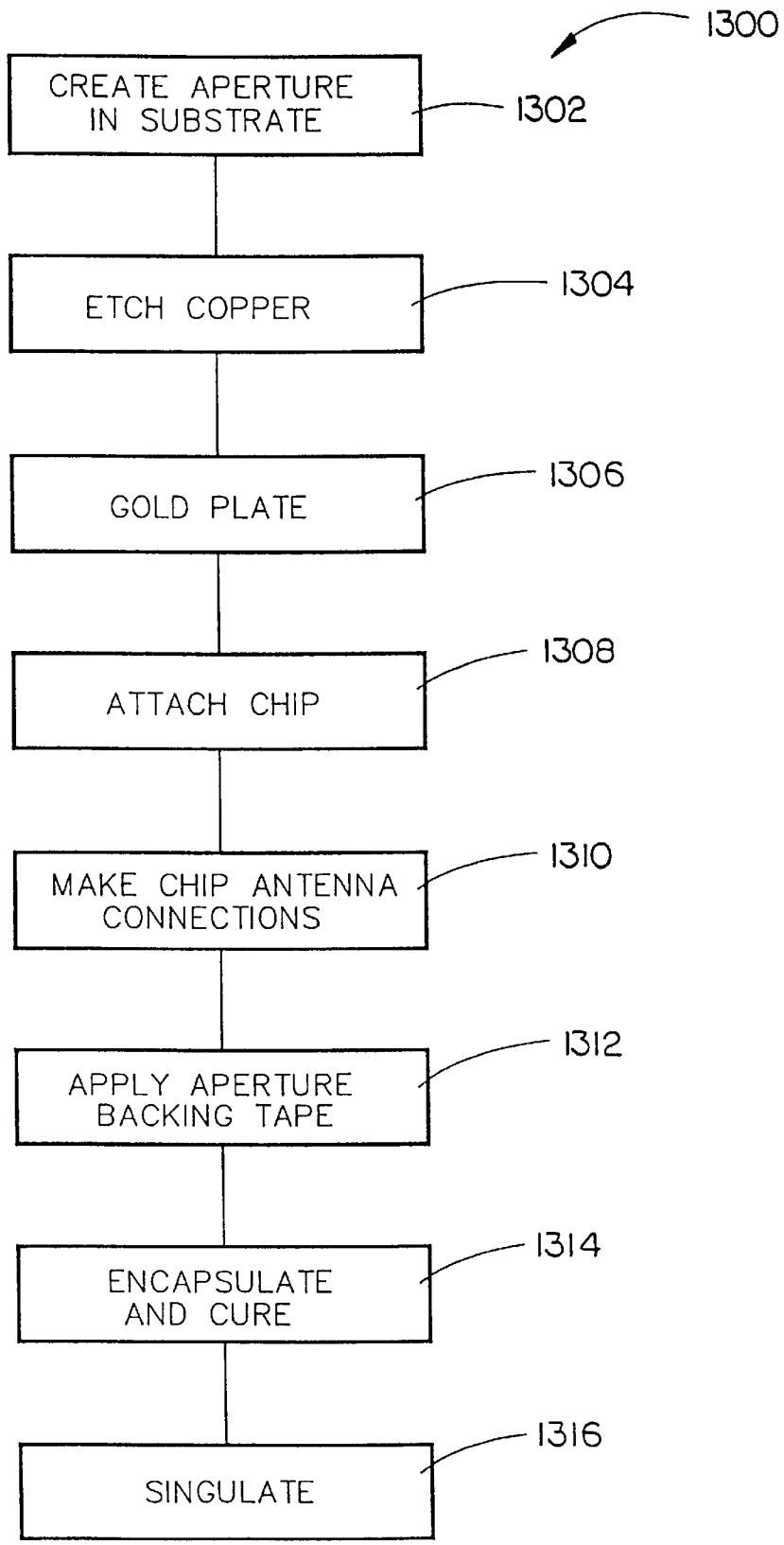
FIG. 13 is a flow diagram illustrating a method for assembling a thin flex RFID tag shown in FIGS. 12A through 12D.

FIG. 13 is a flow diagram summarizing the process of assembling the RFID tag as shown in FIGS. 12A though 12F. The RFID tags may be assembled in a reel-to-reel tape automated bonding (TAB) process using a 70 mm wide role of polyimide laminate flex tape. Preferably, individual RFID tags are not singulated (e.g., separated) from the flex tape until all tags are finished. As shown in FIG. 13, the process 1300 is begun by forming or creating apertures in the polyimide laminate flex tape at step 1302. For example, the flex laminate tape may have a plurality of apertures punched therein at regular intervals as the tape is unrolled. Antennas are formed as an integral part flex tape at step 1304. This is preferably accomplished by depositing a thin layer of a metal, preferably copper, onto the substrate and etching the metal to form pattern of the antenna. The antenna may be electroplated with a thin layer of a second metal such as gold or nickel at step 1306 to facilitate bonding of the antenna to the RFID circuit chip contacts and to prevent corrosion of the copper. Ends of the antenna may be cantilevered over the substrate aperture so that the antenna may be electrically connected to the antenna connector of the circuit chip.

An RFID circuit chip may then be placed within the substrate aperture at step 1308 so that an annular space is formed between the chip and the substrate aperture walls. The circuit chip is then be electrically connected with the antenna via the antenna's cantilevered ends at step 1310.

The substrate aperture is backed at step 1312 by adhering a backing material (i.e., polyimide tape) to the upper surface of the substrate so that the backing material extends over the substrate aperture to form a cavity. An encapsulant is then deposited within the substrate aperture and cured at step 1314. Preferably, the encapsulant fills the annular space between the chip and the substrate aperture walls to secure the chip within the annular space and protect the chip to antenna bonds. After the encapsulant has at least partially cured, the backing material may be removed from the substrate. If desired, a laminate may be applied to one or both sides of the RFID tag package to further protect the tag from damage due to environmental exposure. The finished RFID tags may then be singulated (e.g., punched or cut) from the sheet of substrate at step 1316.

Figure 14:
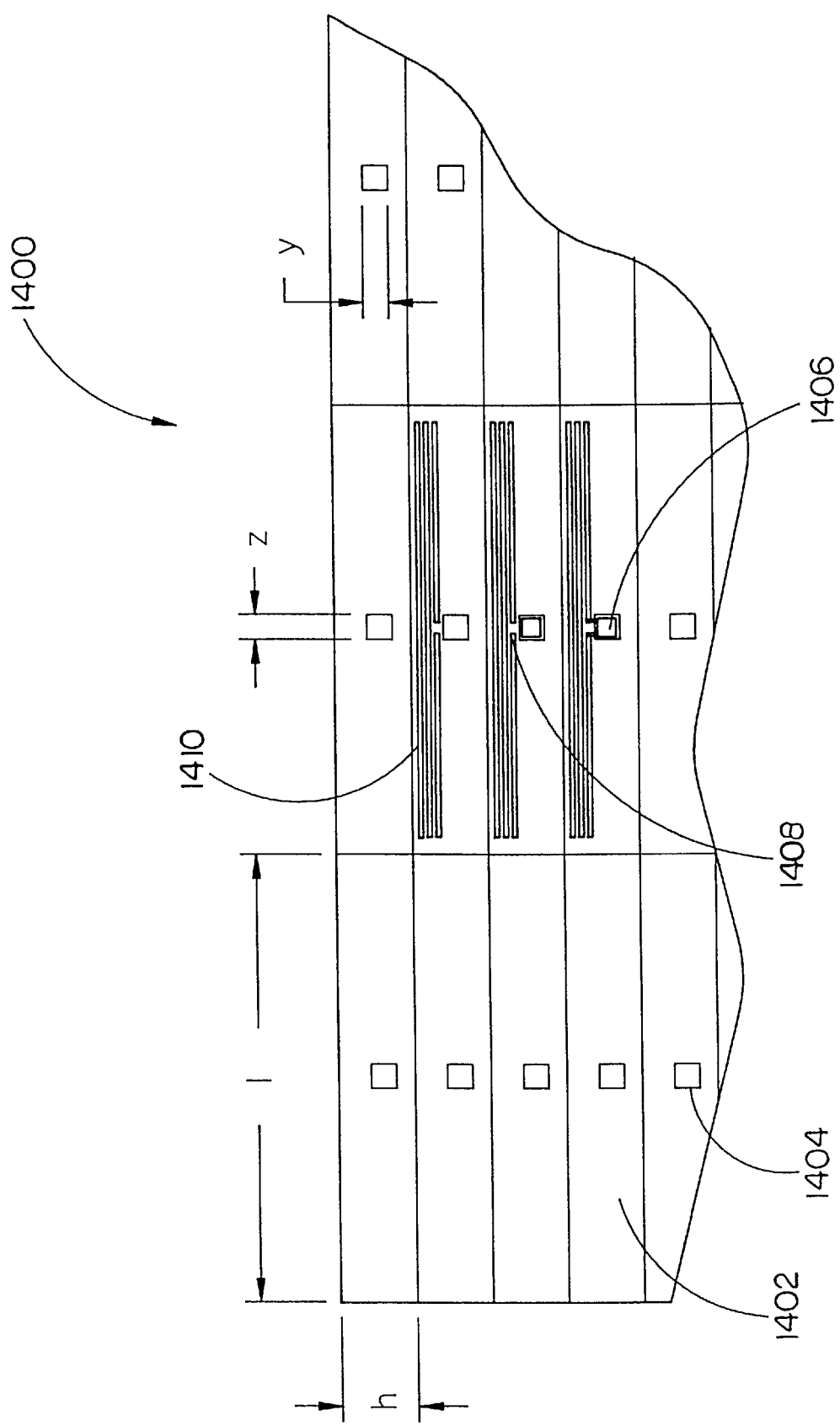
FIG. 14 is a partial top plan view of a sheet of FR-4 substrate material used to manufacture RFID tags prior to singulation.

Referring now to FIG. 14, a plurality of "chip-in-board" RFID tags are shown in various stages of assembly on a panel of substrate material. The panel of substrate material 1400 preferably comprises a thin sheet of glass epoxy circuit board material (FR-4) having a thickness of not more than approximately 200 microns. The panel 1400 may be scored or grooved into small sections 1402 having length (l) and width (w) dimensions which correspond to the length and width of a finished RFID tag (see FIGS. 1 through 4). Preferably, such scoring allows the sections 1402 to be singulated (e.g., separated) from the panel 1400 upon completion of assembly of the RFID tag (see FIGS. 10A through 10D and 11). An aperture 1404 is formed (i.e., via methods such as punching, cutting, etching, etc.). within each section 1402 of the panel 1400. In an exemplary embodiment, each aperture may be generally rectangular in shape, having length (z) and width (y) dimensions which are slightly larger than the corresponding length and width of the circuit chip 1406 to be held therein. An antenna 1408 is formed within each section 1402 of the panel of substrate material 1400. Preferably, the antennas 1408 may be formed by laminating a thin layer of copper 1410 onto the panel of substrate material 1400 and etching the copper to create copper lines forming the antenna. The copper lines may be electroplated with thin layers of a second metal such as gold or nickel (not shown) to facilitate bonding of wire connectors and to improve resistance of the copper to corrosion.

Figure 15:
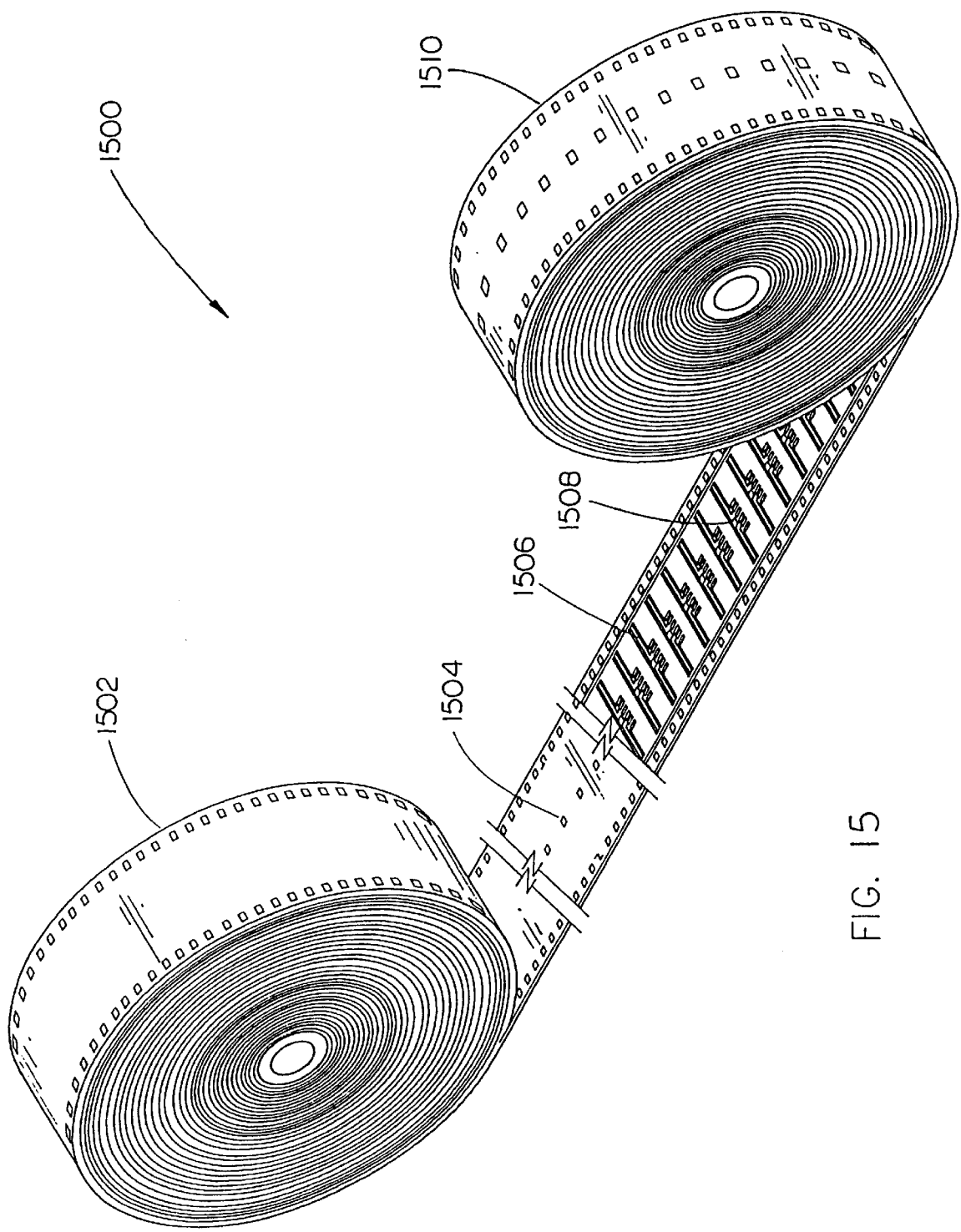
FIG. 15 is an isometric view depicting the manufacture of RFID tags utilizing a tape automated bonding (TAB) process.

Turning now to FIG. 15, RFID tags may alternatively be assembled in a reel-to-reel tape automated bonding (TAB) process using a role of flexible tape of a laminated organic material such as polyimide, polyester, or the like. For example, in a preferred embodiment, a 70 mm wide polyimide flex laminate tape 1500 may be used as a substrate material because of its ability to withstand elevated temperatures which may result from bonding of components and curing of the encapsulant. This tape may be used to assemble RFID tags having dipole antennas having a length of approximately 60 mm. Alternatively, RFID tags having antennas using a meander structure which are approximately 30 mm in length may be assembled. Further, flexible laminate tapes made of substances such as Mylar which are less tolerant of elevated temperatures may be used if low temperature bonding and encapsulating techniques are used.

As shown in FIG. 15, a blank role 1502 of polyimide flex laminate tape may have a plurality of apertures 1506 punched therein at regular intervals as the tape is unwound. Antennas may then be formed on the flex tape 1500 by adhering a thin layer of a metal, preferably copper, onto the tape 1500 and etching the metal to form the antenna pattern. Each antenna 1506 may be electroplated with a thin layer of a second metal such as gold or nickel (not shown) to facilitate bonding of the antenna to contacts disposed on the RFID circuit chip 1508 and to prevent corrosion the copper.

The RFID circuit chip 1508 may then be placed within the aperture 1504 and electrically connected with the antenna. Encapsulant is then deposited within the aperture and cured. If desired, a laminate may be applied to one or both sides of the flex laminate tape 1500 to protect the finished RFID tag from damage due to environmental exposure. The flex laminate tape may then be rolled to form a role of finished RFID tags 1510. The finished RFID tags may then be singulated (e.g., punched or cut) from the sheet of substrate at a later time (i.e., when being embedded within a label).

Figure 16A:
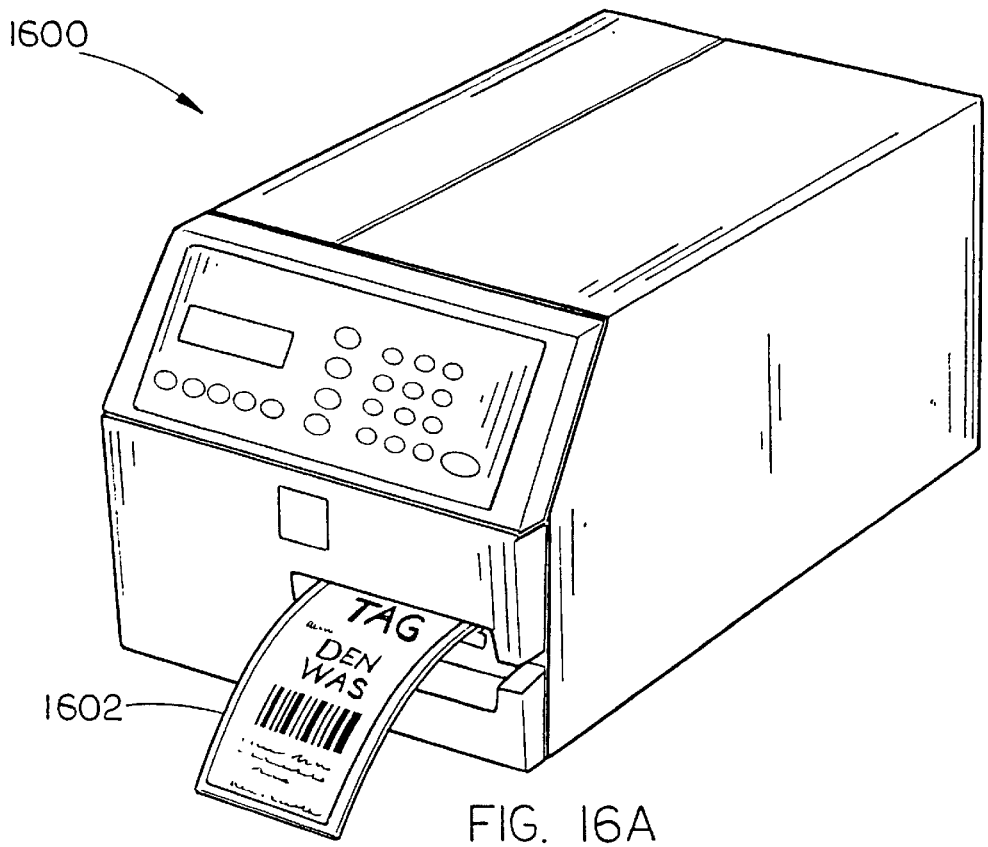
FIG. 16A is an isometric view of a conventional printer used for printing labels.
Figure 16B:
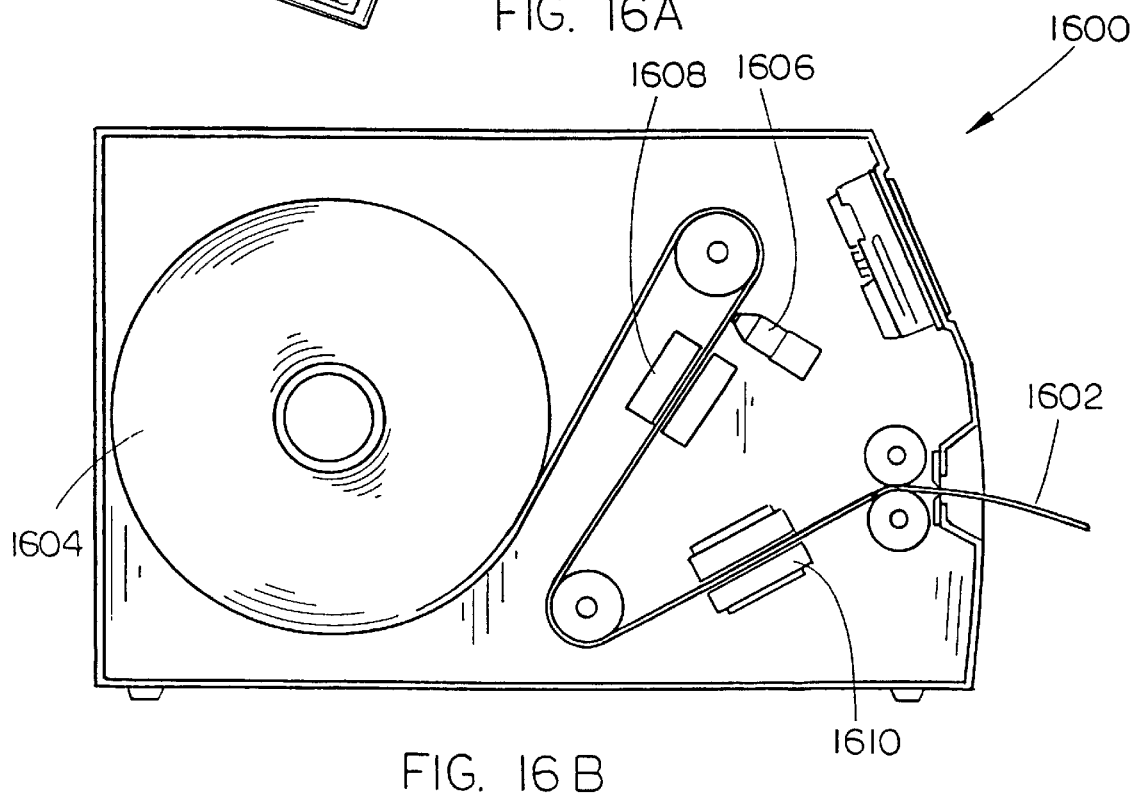
FIG. 16B is a partial cross-sectional side elevation view of the label printing mechanism of the printer shown in FIG. 16A.

FIGS. 16A & 16B depict a typical printer which may be used for printing indicia onto "smart" labels having embedded RFID tags in accordance with the present invention. As shown in FIG. 16A, the printer 1600 may be used to print indicia such as a barcode, alphanumeric characters or the like onto labels 1602.

As shown in FIG. 16B, the printer 1600 may store a role of label stock 1604 comprising a plurality of preprinted "smart" labels 1602 having thin, flexible RFID tags in accordance with the present invention embedded therein. Preferably, the RFID tags embedded within the labels 1602 have thicknesses not exceeding approximately 300 microns. A label stock feeding mechanism 1612 feeds the partially preprinted label stock 1604 through the printer 1600 so that additional printed indicia (i.e., text, alphanumeric characters, optically readable indicia such as barcodes, etc.) may be printed on each label 1602. A label registration determination device 1606 determines printable regions on each label 1602 so that the indicia is not printed over areas containing the embedded RFID tag or which are preprinted. The label stock feeding mechanism 1612 may then pass the label stock 1604 through a printer 1608 so that textual and/or optically readable information may be printed on the label 1602 in a predetermined area (see FIGS. 17A and 17B). A radio frequency transmitter 1610 may write information on a selected RFID tag associated with a selected label 1602.

Figures 17A, 17B:
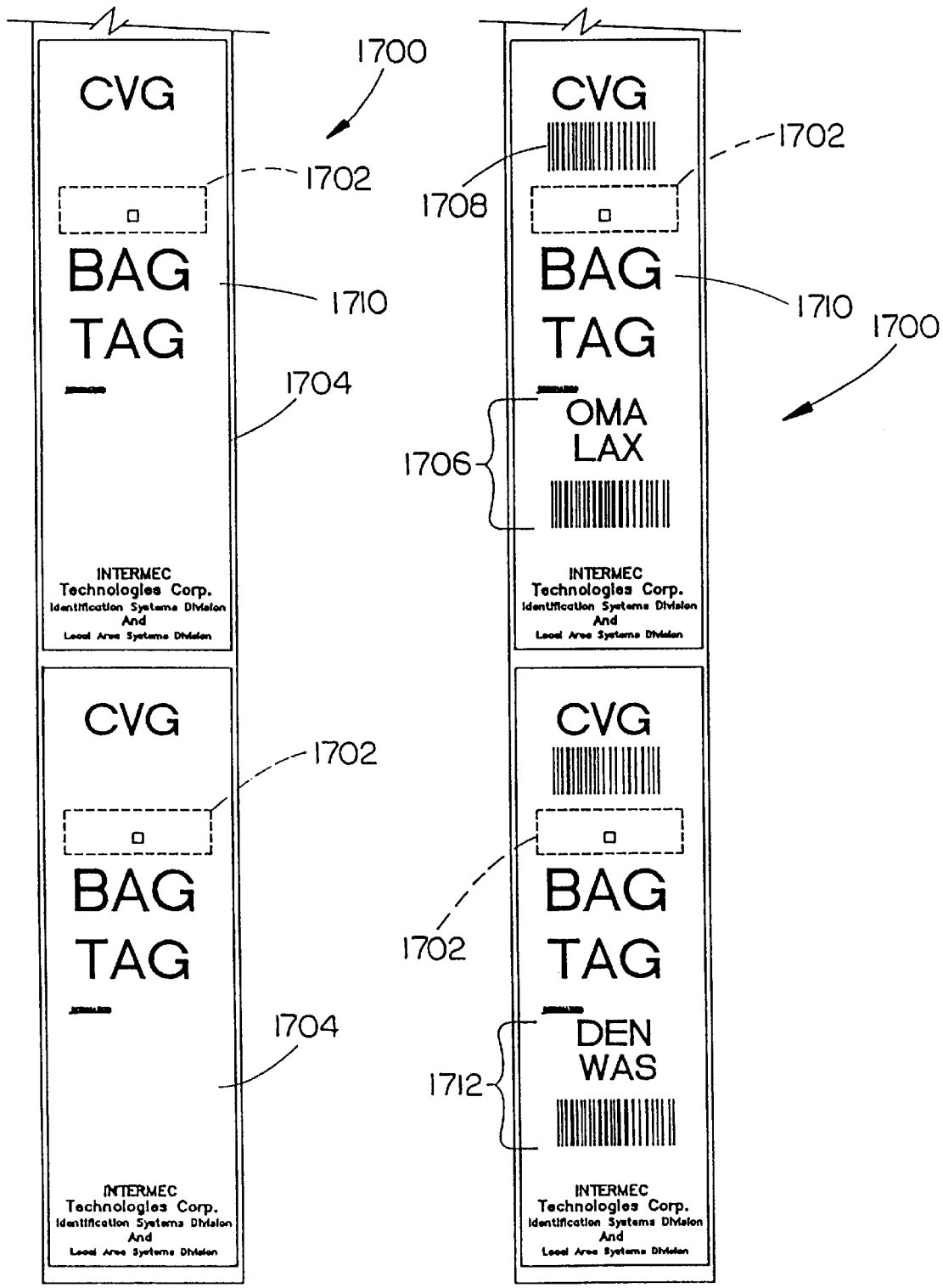
FIG. 17A depicts luggage tags having embedded RFID tags in accordance with the present invention before the labels have been printed with indicia by the printer shown in FIGS. 16A and 16B.
FIG. 17B depicts luggage tags having embedded RFID tags in accordance with the present invention after the labels have been printed with indicia by the printer shown in FIGS. 16A and 16B.

FIGS. 17A and 17B depict "smart" labels in accordance with the present invention. Each "smart" label 1700 preferably includes a thin, flexible RFID tag 1702 embedded or laminated therein. For example, each label 1700 may include an outer face having an area suitable for printing and an inner face having an adhesive backing strip suitable for being attached to an object or itself. Preferably, the adhesive backing strip is temporarily adhered to a removable waxed backing paper so that the label 1700 will not inadvertently cling to the printer or other labels. The RFID tag 1702 may be adhered to the inner face of the label 1700 so that it is laminated between the label 1700 and the backing paper. When the label 1700 is removed from the backing paper and adhered to an object the RFID tag 1702 is embedded between the label 1700 and the object. Preferably, the RFID tags 1702 embedded within the labels 1700 have thicknesses not exceeding approximately 300 microns. In this manner, the labels 1700 may have a thickness less than the widest stock thickness capable of being printed on a standard printer such as a commercially available laser, sprayed ink, impact, orthermal printer. The RFID tags 1702 may be powered by a passive modulated back-scattered field, or, alternatively, the may be actively powered by an internal a battery (see FIGS. 4 and 9).

As shown in FIG. 17A, each label 1700 may include both blank regions or areas (e.g., areas having no printing thereon) 1704 and preprinted regions or areas 1710. Preferably, the preprinted regions 1710 contain information generic to each label 1700 (i.e., the title "BAG TAG", etc.) which is printed onto the label 1700 during its manufacture. As shown in FIG. 17B, the blank regions 1704 of each label 1700 may be printed with information specific to that label (e.g., by printer 1600 shown in FIGS. 16A and 16B). This information may include text, symbols, alphanumeric characters, or optically readable information sets such as barcodes, or the like. For example, wherein "smart" labels 1700 in accordance with the present invention sized for use as a standard airline baggage identification label, it may be desirable to include areas for the printing of destination information both as alphanumeric characters 1706 & 1712 and as optically readable (i.e., barcode) information 1708. Preferably, each label 1700 may include a printer label registration marker for indicating label print regions to the printer (see FIGS. 16A and 16B). This marker is printed on the label's backing paper.

Figure 18A:
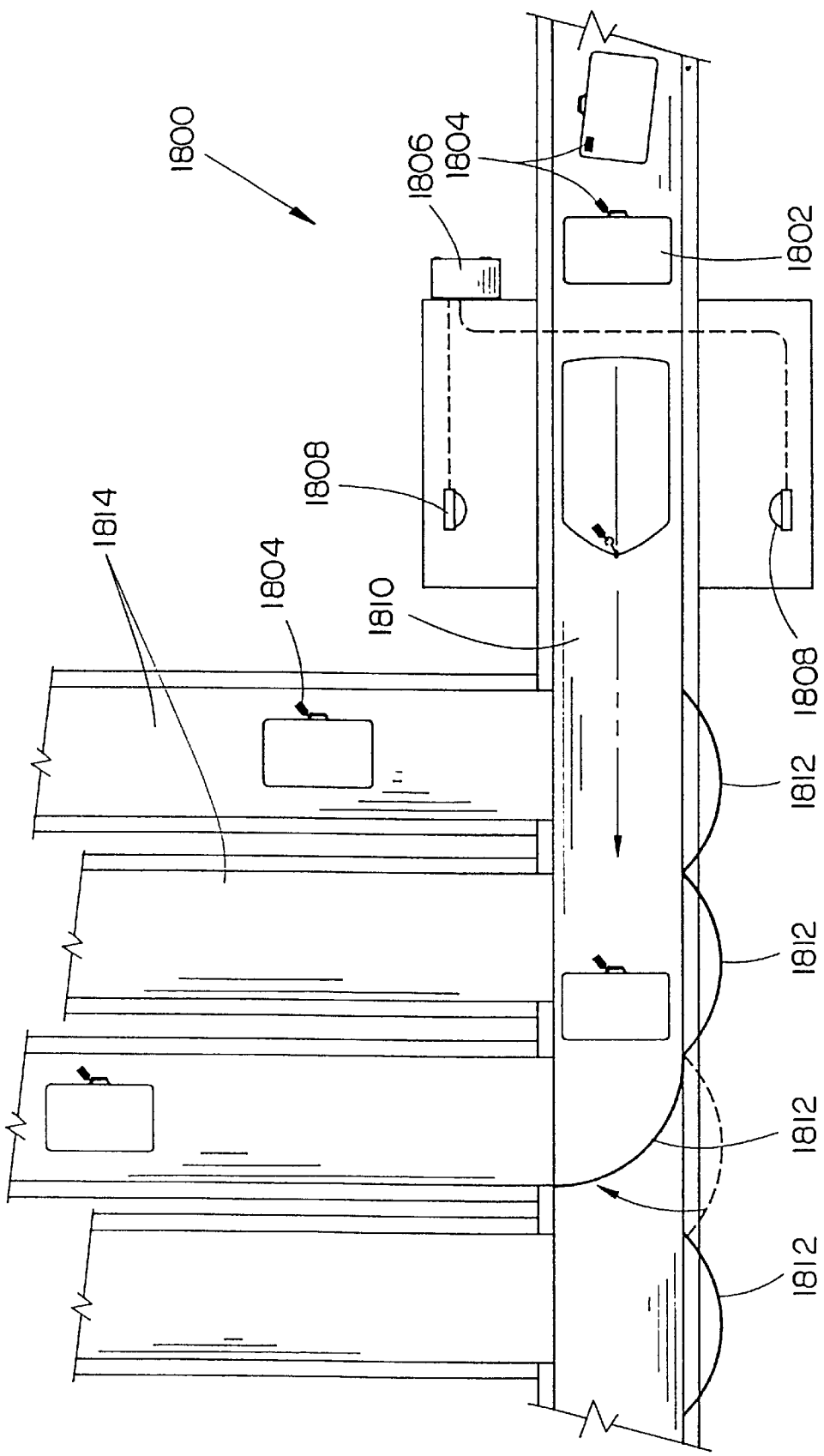
FIG. 18A is a top plan view of a system for automatically sorting luggage labeled with labels embedded with thin RFID tags in accordance with the present invention.
Figure 18B:
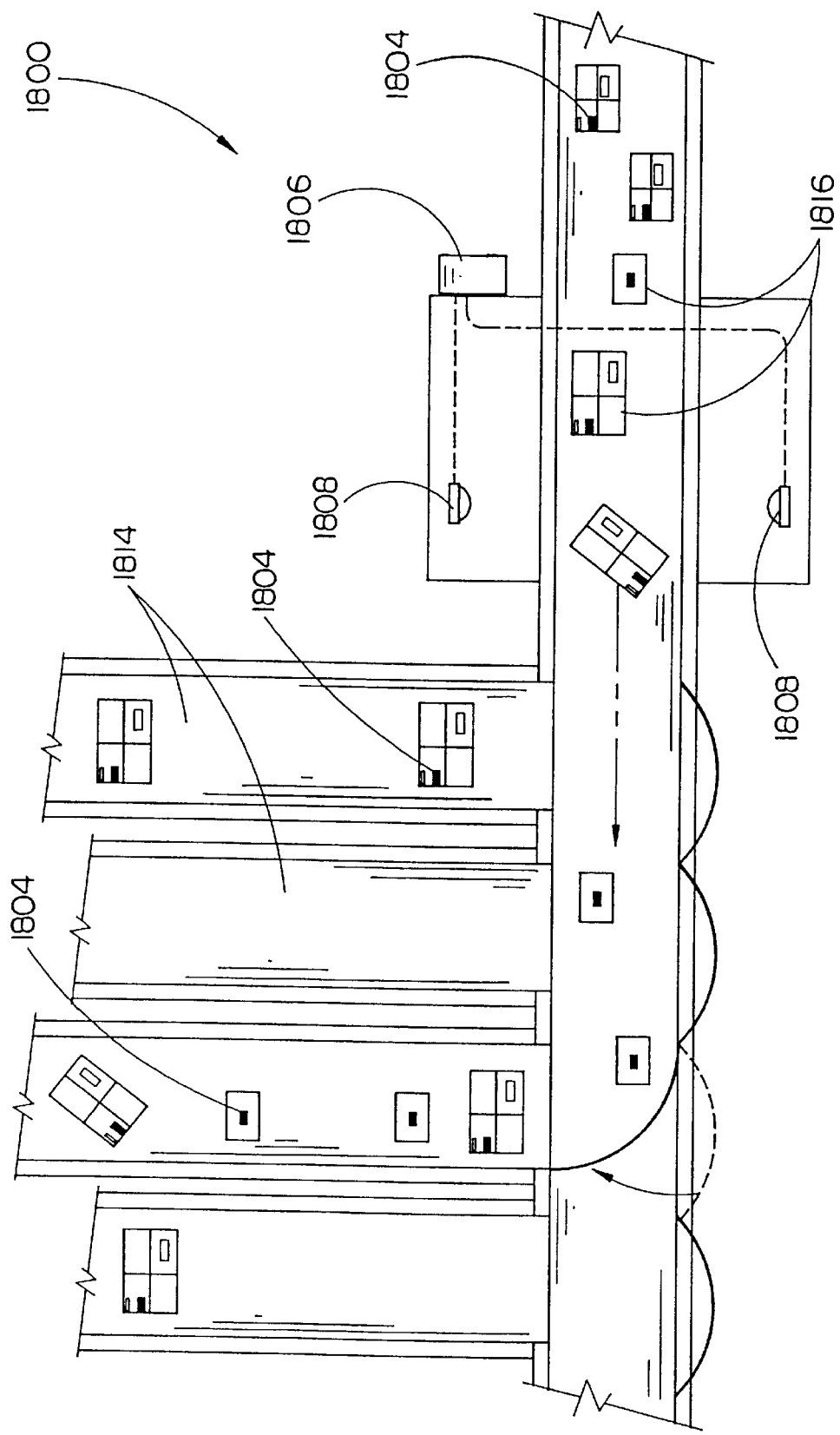
FIG. 18B is a top plan view of a system for automatically sorting packages labeled with labels embedded with thin RFID tags in accordance with the present invention.

Referring now to FIGS. 18A, 18B, and 18C, a typical RFID system is shown. The RFID system 1800 is preferably capable of automatically sorting luggage 1802 (FIG. 18A), packages 1816 (FIG. 18B), and other objects labeled with "smart" labels 1804 embedded with thin, flexible RFID tags in accordance with the present invention. The RFID system 1800 includes a controller or base unit 1806 comprising an RF transceiver (see FIG. 6) coupled to one or more RF antennas 1808. The base unit 1806 interrogates RFID tags embedded within the "smart" labels 1804 as the luggage 1802 or packages 1816 to which they are attached is carried along the system's primary conveyor mechanism 1810 past the antennas 1808. For example, the RFID tag embedded within each "smart" label 1804 may contain destination and routing information for the piece of luggage 1802 or package 1816 to which it is attached. The base unit 1806 may process this information so that the piece of luggage 1802 or package 1816 may be automatically sorted and routed to the appropriate destination. This may be accomplished, in an exemplary embodiment, by temporarily closing a gate 1812 across the primary conveyor mechanism 1810. The gate 1812 causes the piece of luggage 1802 or package 1816 to be diverted onto a secondary conveyor mechanism 1814 corresponding to the destination and routing information contained within the RFID tag of the "smart" label 1804.

Referring now to FIGS. 19, 20, 21 and 22, exemplary applications using thin, flexible RFID tags in accordance with the present invention are shown.

Figure 19:
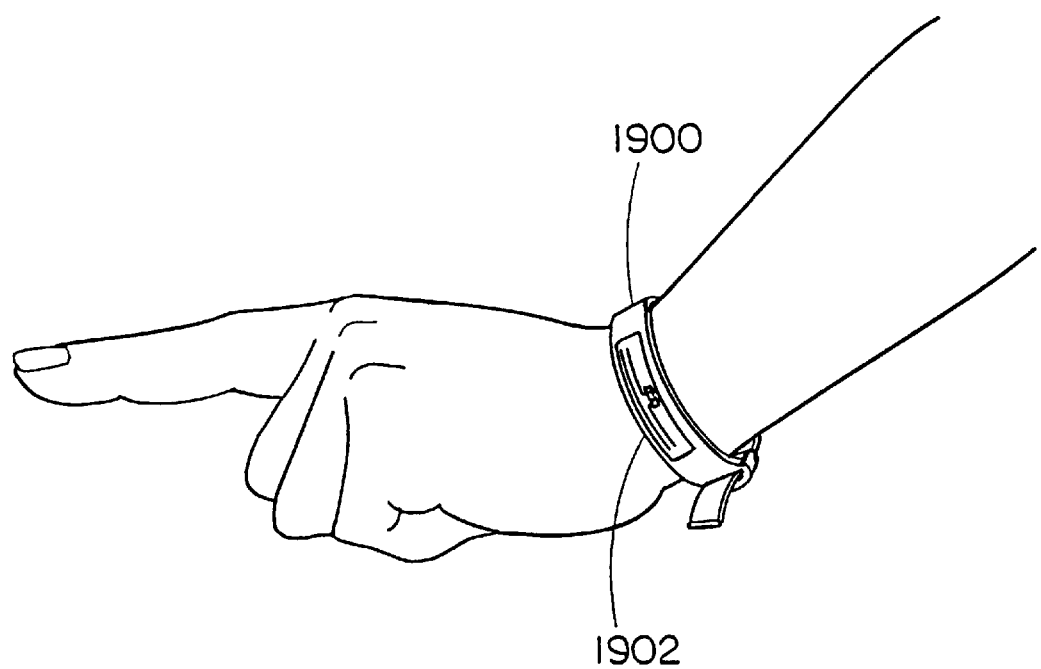
FIG. 19 depicts the use of a thin RFID tag in accordance with the present invention in a wristband.

FIG. 19 depicts a wristband or bracelet 1900 having a thin RFID tag 1902 embedded therein. Such wristbands 1900 may be used to track the movement and status of individuals by an RFID system (not shown). For example, patients in a hospital or like facility may be fitted with a wristband 1900 having an embedded RFID tag 1902. Information may be written to the tag by a transceiver of the hospital's RFID system (not shown). This information may be used to identify the patient, track his or her movement in the hospital, and record important information such as allergies to medications, or the like. The wristband 1900 may further be made difficult to remove (i.e., unfasten or cut) so that it may be used to track the movement of such persons as prisoners, psychiatric patients, or the like.

Figure 20:
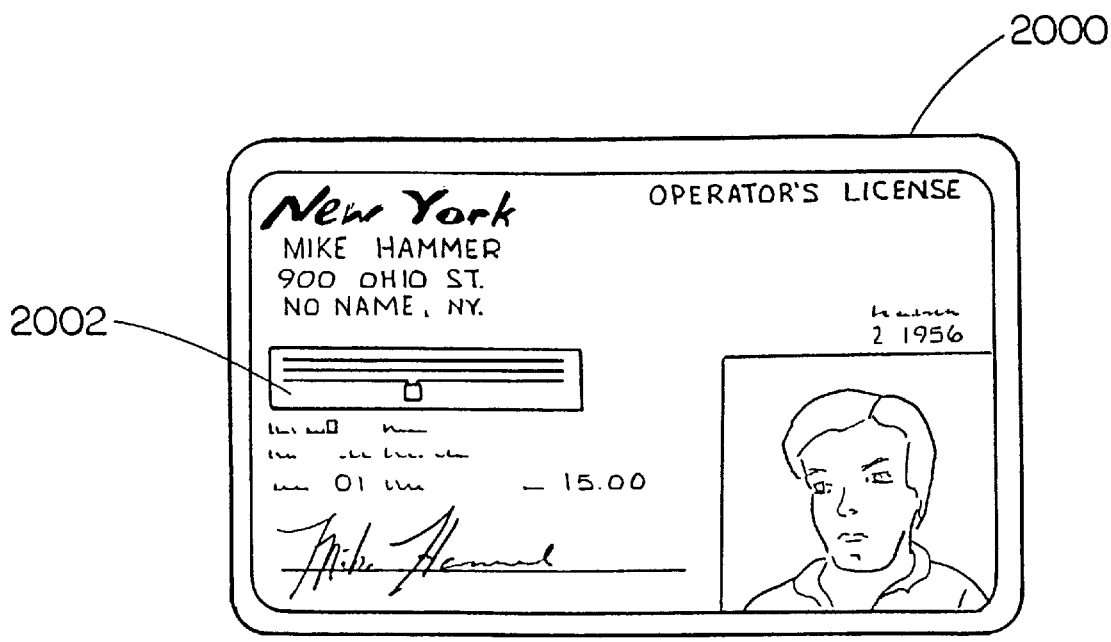
FIG. 20 depicts the use of a thin RFID tag in accordance with the present invention in a driver's license.

FIG. 20 depicts an identification card 2000 such as driver's license, student identification card, employee identification badge, credit card, debit card, etc. having a thin, flexible RFID tag 2002 embedded therein. Information including the card holder's identification, age, driving record, driving restrictions, organ donor information, account balance, or the like may be written to the RFID tag 2002 by the entity (i.e., government agency, school, employer, bank, etc.) issuing the card 2000. The information may be encrypted for security purposes. The information may then read from the RFID tag 2002 to identify the card holder. For example, as shown in FIG. 20, the identification card 2000 may comprise a driver's license issued by a governmental agency. The RFID tag embedded within the driver's license may contain information identifying the driver (and other passengers holding an identification card 2000). If the driver is stopped by a law enforcement officer, a transceiver mounted within the officers patrol car or carried by the officer may automatically interrogate the RFID tag embedded within the driver's license to retrieve the identity of the driver. In this manner, the law enforcement officer may be provided with essential identifying information for the driver without being exposed to possible danger by approaching the stopped automobile.

Figure 21:
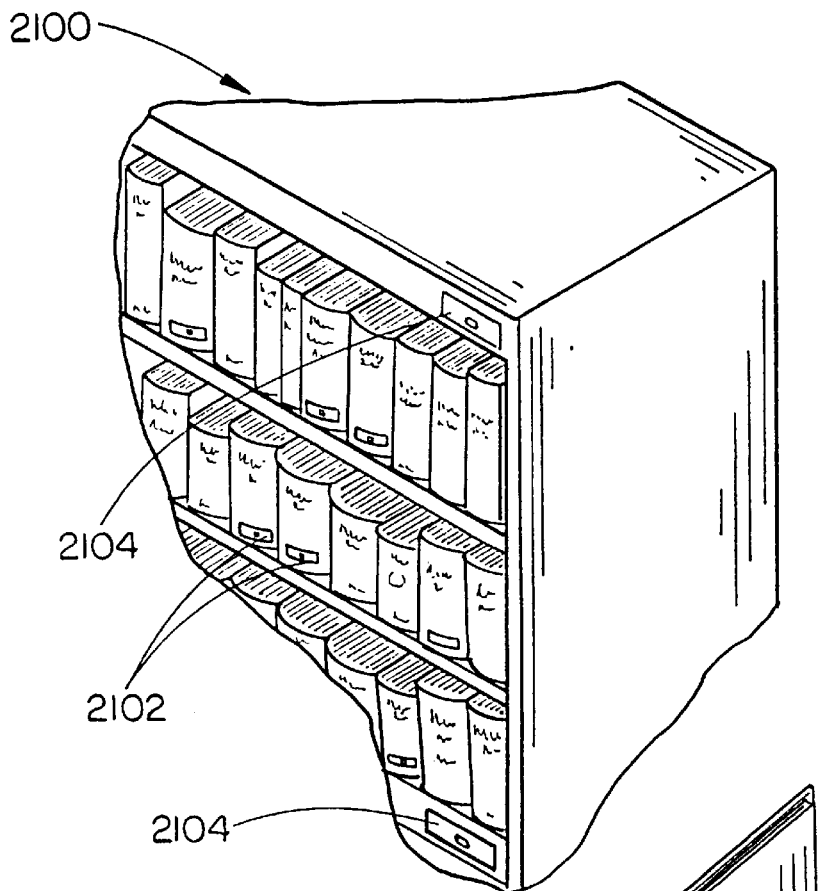
FIG. 21 depicts the use of a thin RFID tag in accordance with the present invention for identifying books in a depository.

FIG. 21 depicts a depository such as a library or the like 2100 wherein thin, flexible RFID tags 2102 and 2104 in accordance with the present invention may be used for identifying and tracking information sources such as books, magazines, optical and magnetic storage media, or the like. The RFID tags 2102 may be embedded in the spines of books (shown), in the covers of magazines, or in the cases of compact disks (CD), tapes and may contain information such as the information source's catalog number. In this manner, the RFID tags 2102 may be used to identify and track the source as it is checked in or out of the depository or library. The RFID tags 2104 may also be placed on specific bookcases or shelves to aid in locating books or other information sources.

Figure 22:
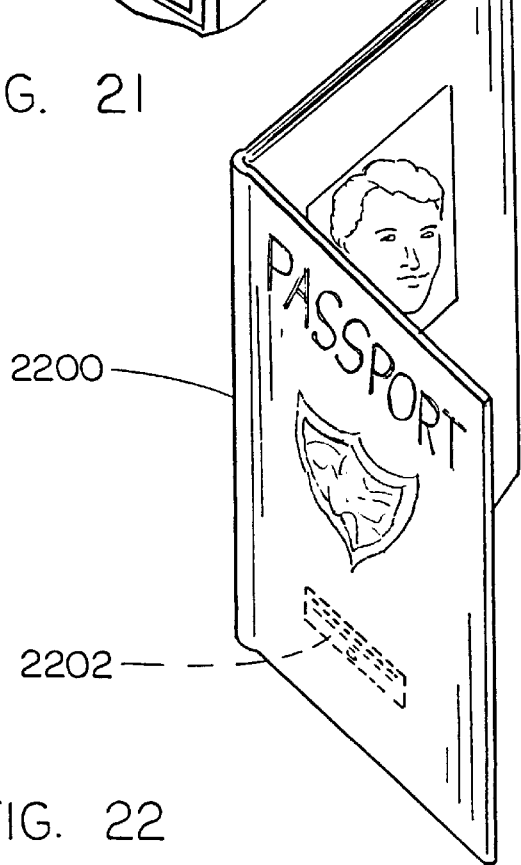
FIG. 22 depicts the use of a thin RFID tag in accordance with the present invention in a passport.

FIG. 22 depicts a passport 2200 having an RFID tag 2202 embedded within its cover. The RFID tag may instantaneously provide information for processing individuals passing through a governmental customs agency upon entering or leaving a country. For example, an RFID system (not shown) may interrogate the tag 2202 as the individual holding the passport 2200 approaches the customs agent. Information such as, for example, the individuals name, country of origin, citizenship, vaccination record, etc. may be retrieved from the RFID tag 2202 and displayed to the customs agent via a terminal. In this manner, the time necessary to process the individual through customs may be greatly reduced.

It is believed that the radio frequency identification (RFID) system of the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A thin flexible electronic radio frequency tag circuit comprising:
   a. an insulating, flexible substrate having an aperture therein;
   b. an antenna forming an integral part of said substrate;
   c. a circuit chip having an antenna connector, said circuit chip being substantially and operably located within the aperture of said substrate;
   d. a connector for electrically connecting said antenna to said chip antenna connector; and
   e. an encapsulant having a flattened outer surface substantially parallel with said substrate, said encapsulant operably retaining said circuit chip within said substrate.

2. A circuit, as in claim 1, wherein said encapsulant is milled after cure so as to reduce the overall cross-sectional thickness of said encapsulant and thereby providing a thin flexible electronic radio frequency tag having a cross-sectional profile thickness not unnecessarily increased by said encapsulant.

3. A circuit, as in claim 1, wherein said substrate has at least one dimension not exceeding 200 microns.

4. A circuit, as in claim 3, wherein said circuit chip has at least one dimension not exceeding 200 microns.

5. A circuit, as in claim 3, wherein said finished encapsulant does not increase the overall thickness of said substrate by more than 90 microns.

6. A circuit, as in claim 1, wherein said thin flexible electronic radio frequency tag has at least one dimension not exceeding 280 microns.

7. A circuit, as in claim 1, wherein said substrate is a fire-proof circuit board material.

8. A circuit, as in claim 1, wherein said substrate is an organic.

9. A circuit, as in claim 8, wherein said substrate is polyimide.

10. A circuit, as in claim 8, wherein said substrate is polyester.

11. A circuit, as in claim 1, wherein said connector for electrically connecting said antenna to said chip antenna connector is made using any of the bonding types including wire bonding, thermal compression, single point bonding, C4 bonding, and conductive adhesive.

12. A circuit, as in claim 1, wherein said connector for electrically connecting said antenna to said chip antenna connector is low profile wire bonding.

13. A circuit, as in claim 1, wherein said circuit is laminated on at least one side.

14. A circuit, as in claim 1, wherein said antenna is a resonant antenna and is one of the following structures including folded dipole, dipole, and loop.

15. A circuit, as in claim 14, further including an antenna impedance adjustment element.

16. A circuit, as in claim 15, wherein said antenna impedance adjustment element is an integral part of said substrate.

17. A circuit, as in claim 16, wherein said antenna impedance adjustment element is parasitic.

18. A circuit, as in claim 1, wherein a battery is affixed to the substrate in adjacent proximity to the antenna and chip and is connected by one or more battery connecting lines to two or more chip battery contacts wherein the battery contacts are coplanar with the antenna and connecting lines.

19. A circuit, as in claim 1, wherein said encapsulant encapsulates said chip within said aperture and said chip to said antenna and said chip connector.

20. A circuit, as in claim 19, wherein said encapsulant forms an at least somewhat flexible bond between said chip within said substrate aperture and said antenna and chip connector.

21. A circuit, as in claim 19, wherein said encapsulant forms at least one surface coplanar with at least one surface of said substrate.

22. A thin flexible electronic radio frequency tag circuit comprising:
   a. an insulating, flexible substrate having an aperture therein;
   b. an antenna forming an integral part of said substrate;
   c. a circuit chip having a modulator circuit, a logic circuit, a memory circuit, and chip antenna connector, said circuit chip being substantially and operably located within the aperture of said substrate such that an annular space is formed between said chip and said substrate;

d. a connector for electrically connecting said antenna to said chip antenna connector; and e. a fastener filling the annular space between said circuit chip and said substrate aperture for securing said circuit chip within said substrate aperture and forming a protective covering over said circuit chip, said antenna connector and at least some portion of said antenna, said fastener having a flattened cross-sectional profile including a bottom surface coplanar to the bottom surface of said substrate and a generally flat upper surface parallel to said bottom surface whereby the cross-sectional thickness of said circuit is not unnecessarily increased.

23. A circuit, as in claim 22, wherein said chip fastener does not substantially reduce the overall flexibility of said circuit about more than one axis.

24. A circuit, as in claim 22, wherein said thin flexible electronic radio frequency tag has at least one dimension not exceeding 280 microns.

25. A thin flexible electronic radio frequency tag circuit, comprising:

a. a substrate having an aperture thereon for receiving a radio frequency circuit chip;

b. a radio frequency circuit chip disposed within said substrate aperture;

c. an antenna disposed on said substrate and coupled to said radio frequency circuit chip; and d. an encapsulant disposed on said substrate for encapsulating said radio frequency circuit chip, said encapsulant having a flattened outer surface substantially parallel with said substrate thereby providing a reduced thickness to allow the tag to pass through a printer without causing damage to said tag or said printer.

26. A circuit, as in claim 25, wherein said encapsulant is milled after cure so as to reduce the overall cross-sectional thickness of said encapsulant and thereby providing a thin flexible electronic radio frequency tag having a cross-sectional profile thickness not unnecessarily increased by said encapsulant.

27. A circuit, as in claim 26, wherein said finished encapsulant does not increase the overall thickness of said substrate by more than 90 microns.

28. A circuit, as in claim 25, wherein said substrate has at least one dimension not exceeding 200 microns.

29. A circuit, as in claim 28, wherein said circuit chip has at least one dimension not exceeding 200 microns.

30. A circuit, as in claim 25, wherein said thin flexible electronic radio frequency tag has at least one dimension not exceeding 280 microns.

31. A circuit, as in claim 25, wherein said substrate is a fire-proof circuit board material.

32. A circuit, as in claim 25, wherein said substrate is an organic.

33. A circuit, as in claim 32, wherein said substrate is polyimide.

34. A circuit, as in claim 32, wherein said substrate is polyester.

35. A circuit, as in claim 25, wherein said antenna is coupled to said chip using any of the bonding types including wire bonding, thermal compression, single point bonding, C4 bonding, and conductive adhesive.

36. A circuit, as in claim 25, wherein said antenna is coupled to said chip using low profile wire bonding.

37. A circuit, as in claim 25, wherein said circuit is laminated on at least one side.

38. A circuit, as in claim 25, wherein said antenna is a resonant antenna and is one of the following structures including folded dipole, dipole, and loop.

39. A circuit, as in claim 38, further including an antenna impedance adjustment element.

40. A circuit, as in claim 39, wherein said antenna impedance adjustment element is an integral part of said substrate.

41. A circuit, as in claim 40, wherein said antenna impedance adjustment element is parasitic.

42. A circuit, as in claim 41, wherein said encapsulant forms an at least somewhat flexible bond between said chip within said substrate aperture and said antenna and chip connector.

43. A circuit, as in claim 39, wherein said encapsulant forms at least one surface coplanar with at least one surface of said substrate.

44. A circuit, as in claim 25, wherein a battery is affixed to the substrate in adjacent proximity to the antenna and chip and is connected by one or more battery connecting lines to two or more chip battery contacts wherein the battery contacts are coplanar with the antenna and connecting lines.

45. A circuit, as in claim 25, wherein said encapsulant encapsulates said chip within said aperture and said chip to said antenna and said chip connector.

* * * * *